(12) United States Patent
Jackson et al.

(10) Patent No.: US 11,670,962 B2
(45) Date of Patent: Jun. 6, 2023

(54) ELECTRONIC DEVICE WITH COIL FOR WIRELESS CHARGING AND HAPTIC OUTPUTS

(71) Applicant: Apple Inc., Cupertino, CA (US)

(72) Inventors: Benjamin G. Jackson, Belmont, CA (US); Brenton A. Baugh, Los Altos Hills, CA (US); Brian T. Gleeson, Mountain View, CA (US); Steven J. Taylor, San Jose, CA (US); Thayne M. Miller, San Jose, CA (US)

(73) Assignee: APPLE INC., Cupertino, CA (US)

( * ) Notice: Subject to any disclaimer, the term of this patent is extended or adjusted under 35 U.S.C. 154(b) by 371 days.

(21) Appl. No.: 16/821,853

(22) Filed: Mar. 17, 2020

(65) Prior Publication Data

US 2020/0328614 A1  Oct. 15, 2020

Related U.S. Application Data

(60) Provisional application No. 62/831,584, filed on Apr. 9, 2019.

(51) Int. Cl.
*H02J 50/00* (2016.01)
*H02J 50/10* (2016.01)
(Continued)

(52) U.S. Cl.
CPC .............. *H02J 50/10* (2016.02); *G04C 10/04* (2013.01); *G04G 19/00* (2013.01); *H01F 38/14* (2013.01);
(Continued)

(58) Field of Classification Search
CPC .. H02J 50/10; H02J 7/0063; H02J 7/02; H02J 7/00; G04C 10/04; G04G 19/00; H01F 38/14; H03K 2217/96062; H04R 2400/03
See application file for complete search history.

(56) References Cited

U.S. PATENT DOCUMENTS 9,276,639 B2 * 3/2016 Terlizzi ................ H04B 5/0006
9,465,365 B2 * 10/2016 Nichol ..................... A61B 5/681
(Continued)

FOREIGN PATENT DOCUMENTS

AU 2013260687 B2 * 4/2016 ............. G04C 3/002
CH 692639 A5 * 8/2002 ............. G04B 19/30
(Continued)

OTHER PUBLICATIONS

International Search Report and Written Opinion dated Jul. 14, 2020, PCT/US2020/027061, 9 pages.

*Primary Examiner* — Naum Levin
(74) *Attorney, Agent, or Firm* — Brownstein Hyatt Farber Schreck, LLP

(57) ABSTRACT

An electronic watch may include a housing, a display positioned at least partially within the housing, a transparent cover coupled to the housing and at least partially covering the display, a battery, and a coil coupled to the battery and configured to, during a battery charging operation, supply a first current to the battery and, during a haptic output operation, receive a second current from the battery to produce a haptic output. The electronic watch may further include a ferromagnetic element positioned at least partially within the housing and movable relative to the housing. The second current may cause the coil to produce a magnetic field, and the haptic output may be produced as a result of an interaction between the magnetic field and the ferromagnetic element that causes the ferromagnetic element to move relative to the housing.

20 Claims, 13 Drawing Sheets

(51) Int. Cl.
*G04C 10/04* (2006.01)
*G04G 19/00* (2006.01)
*H01F 38/14* (2006.01)
*H02J 7/00* (2006.01)
*H02J 7/02* (2016.01)
*H01H 3/00* (2006.01)

(52) U.S. Cl.
CPC ............. *H02J 7/0063* (2013.01); *H02J 7/02* (2013.01); *H01H 2003/008* (2013.01); *H03K 2217/96062* (2013.01); *H04R 2400/03* (2013.01)

(56) References Cited

U.S. PATENT DOCUMENTS

| | | | | |
|---|---|---|---|---|
| 9,577,467 | B1* | 2/2017 | Karanikos | H02J 50/005 |
| 9,660,703 | B1* | 5/2017 | Knoedgen | H04B 5/0037 |
| 9,668,367 | B2* | 5/2017 | Fleck | G06F 3/014 |
| 10,014,710 | B2* | 7/2018 | Cheah | H01L 25/18 |
| 10,193,374 | B2* | 1/2019 | Kursula | H04B 5/0037 |
| 10,256,656 | B2* | 4/2019 | Mansour | H02J 7/025 |
| 10,296,089 | B2* | 5/2019 | Peretz | G06F 3/016 |
| 10,327,974 | B2* | 6/2019 | Levesque | A61F 2/02 |
| 10,409,379 | B1* | 9/2019 | Khoshkava | B06B 1/0611 |
| 10,787,014 | B2* | 9/2020 | Hooton | H01P 3/08 |
| 10,831,276 | B2* | 11/2020 | Cincione | G06F 3/016 |
| 10,885,807 | B1* | 1/2021 | Lavi | G09B 7/00 |
| 11,221,590 | B2* | 1/2022 | Rothkopf | G06F 3/016 |
| 2012/0049790 | A1* | 3/2012 | Wu | G04C 10/00 320/108 |
| 2014/0241555 | A1 | 8/2014 | Terlizzi | |
| 2015/0137733 | A1* | 5/2015 | Si | H02J 7/32 320/101 |
| 2016/0063828 | A1* | 3/2016 | Moussette | H04M 1/72454 340/691.5 |
| 2016/0139671 | A1* | 5/2016 | Jun | G06F 3/04886 715/702 |
| 2016/0378070 | A1* | 12/2016 | Rothkopf | G06F 3/015 368/10 |
| 2017/0179749 | A1* | 6/2017 | Mansour | H04B 5/0037 |
| 2017/0288443 | A1 | 10/2017 | Kursula et al. | |
| 2018/0046249 | A1 | 2/2018 | Peretz et al. | |
| 2019/0310706 | A1* | 10/2019 | Wang | H02J 7/32 |
| 2020/0192423 | A1* | 6/2020 | Hsu | G06F 1/163 |

FOREIGN PATENT DOCUMENTS

| | | | | |
|---|---|---|---|---|
| CN | 101479913 A | * | 7/2009 | ........ H01M 10/4264 |
| CN | 101867203 | | 10/2010 | |
| CN | 105045414 | | 11/2015 | |
| CN | 105379136 | | 3/2016 | |
| CN | 105813804 | | 7/2016 | |
| CN | 106249581 A | * | 12/2016 | ............. G04G 19/00 |
| CN | 205983029 U | * | 2/2017 | |
| CN | 106510109 | | 3/2017 | |
| CN | 106575230 A | * | 4/2017 | .......... G06F 11/0745 |
| CN | 106605353 | | 4/2017 | |
| CN | 108121482 | | 6/2018 | |
| CN | 109462291 | | 3/2019 | |
| CN | 109564480 | | 4/2019 | |
| CN | 112312693 B | * | 3/2022 | ............. B60R 11/02 |
| JP | 2011030113 A | * | 2/2011 | |
| JP | 2017534305 A | * | 11/2017 | |
| JP | 2018074899 A | * | 5/2018 | ............. A41D 1/002 |
| WO | WO-2005103870 A1 | * | 11/2005 | ............. G06F 1/1613 |
| WO | WO-2015054690 A1 | * | 4/2015 | ............. G04G 17/02 |
| WO | WO 17/172012 | | 10/2017 | |

* cited by examiner

ELECTRONIC DEVICE WITH COIL FOR WIRELESS CHARGING AND HAPTIC OUTPUTS

CROSS-REFERENCE TO RELATED APPLICATION

This application is a nonprovisional of and claims the benefit under 35 U.S.C. § 119(e) of U.S. Provisional Patent Application No. 62/831,584, filed Apr. 9, 2019, the contents of which are incorporated herein by reference as if fully disclosed herein.

FIELD

The described embodiments relate generally to electronic devices, and more particularly to electronic devices with a coil for wireless charging and haptic outputs.

BACKGROUND

Electronic devices frequently use batteries to provide power to the device and enable the device to be used without being tethered to an outlet or other stationary power supply. Such batteries must be recharged (or replaced) periodically to allow continued use of the device.

SUMMARY

An electronic watch may include a housing, a display positioned at least partially within the housing, a transparent cover coupled to the housing and at least partially covering the display, a battery, and a coil coupled to the battery and configured to, during a battery charging operation, supply a first current to the battery, and, during a haptic output operation, receive a second current from the battery to produce a haptic output. The electronic watch may further include a ferromagnetic element positioned at least partially within the housing and movable relative to the housing. The second current may cause the coil to produce a magnetic field, and the haptic output may be produced as a result of an interaction between the magnetic field and the ferromagnetic element that causes the ferromagnetic element to move relative to the housing. The ferromagnetic element may be movably coupled to the housing via a compliant member. The coil may be configured to produce the first current as a result of a wireless power transfer from an external charger to the coil.

The coil may be configured to inductively couple to an output coil of an external charging device during the battery charging operation. The housing may include a first housing member defining a first exterior surface of the housing, and a second housing member movable relative to the first housing member and defining a second exterior surface of the housing configured to contact a user when the electronic watch is being worn. The haptic output may be produced by moving the second housing member relative to the first housing member when the electronic watch is being worn. The transparent cover may define a front surface of the electronic watch, and the second housing member may define at least a portion of a rear surface of the electronic watch, the rear surface opposite the front surface.

The coil may include multiple conductive windings. During the battery charging operation, a first grouping of the conductive windings may supply the first current to the battery, and during the haptic output operation, a second grouping of the conductive windings may receive the second current from the battery, the first grouping different than the second grouping.

An electronic device may include a housing defining an exterior surface of the electronic device, a battery positioned at least partially within the housing, a coil positioned at least partially within the housing, and a movable mass positioned at least partially within the housing. In a first mode of operation, the coil may wirelessly receive power from an external power source, the received power being provided to the battery, and in a second mode of operation, the coil may receive a drive signal, thereby causing the movable mass to move and produce a haptic output along the exterior surface of the housing.

The electronic device may be a stylus, and may include an elongate housing defining a first end and a second end and defining an internal cavity, and a tip positioned at the second end of the elongate housing and configured to provide input to an additional electronic device. The stylus may be configured to receive power from the additional electronic device along a side surface of the elongate housing.

The electronic device may be a watch and may further include a display positioned at least partially within the housing and configured to display a graphical output, a transparent cover positioned over the display, and a touch sensor positioned below the transparent cover and configured to detect a touch input applied to the transparent cover. The housing may define a rear wall along a rear side that is opposite to the transparent cover, and the coil may be configured to inductively couple to an output coil through the rear wall of the housing when the electronic device is in the first mode of operation.

The movable mass may be a permanent magnet and, in the second mode of operation, the drive signal may cause a current to pass through the coil, and the coil may cause the permanent magnet to move as a result of an interaction between a magnetic field produced by the permanent magnet and Lorentz forces acting on the coil.

The movable mass may be a ferromagnetic material and, in the second mode of operation, the drive signal may cause the coil to produce a magnetic field, and the ferromagnetic material moves as a result of a reluctance force produced by an interaction between the ferromagnetic material and the magnetic field produced by the coil.

The movable mass may be coupled to the housing via a compliant member that allows the movable mass to move relative to the housing, and the electronic device may further include a retention system configured to constrain movement of the movable mass when the device is in the first mode of operation.

The coil may include two conductive windings, and the electronic device may further include a switching circuit configured to conductively couple the two conductive windings during one of the first mode of operation or the second mode of operation and conductively decouple the two conductive windings during the other of the first mode of operation or the second mode of operation. The coil may include multiple turns of a wire wrapped about a central area, and the movable mass may be positioned at least partially within the central area.

An electronic device may include a housing comprising a dielectric member defining at least a portion of the electronic device, a display positioned at least partially within the housing, a transparent cover positioned over the display and defining a front surface of the electronic device, a battery positioned at least partially within the housing, and a coil positioned at least partially within the housing. The coil may be configured to produce a current when inductively coupled to an output coil through the dielectric member and produce a magnetic field when supplied with a current from the battery, thereby producing a haptic output detectable along an exterior surface of the electronic device.

The electronic device may further include a movable mass movably coupled to the housing, and the haptic output may be produced as a result of the magnetic field causing the movable mass to move relative to the housing. The electronic device may further include a retention system configured to secure the movable mass when the coil is inductively coupled to the output coil, and release the movable mass when the coil is supplied with a current from the battery to produce the haptic output. The movable mass may include a ferromagnetic material, and the ferromagnetic material may move as a result of a reluctance force produced by an interaction between the ferromagnetic material and the magnetic field produced by the coil.

The housing may include a metal housing member coupled to the dielectric member and defining a side surface of the electronic device. The dielectric member may include a material selected from the group consisting of sapphire, polymer, ceramic, and glass.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
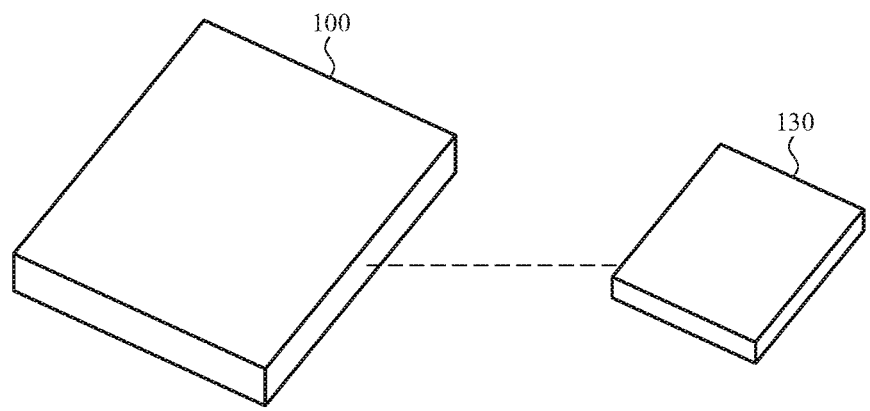
FIGS. 1A-1B depict an example system having an electronic device and a charging device.

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The embodiments herein are generally directed to an electronic device that is capable of being recharged wirelessly. For example, a smartwatch with a rechargeable battery may be recharged by placing the smartwatch on or in proximity to a charging mat, charging dock, or other type of external charging device that can charge the smartwatch without a cable being plugged into the smartwatch. In such systems, charging of the device (e.g., the smartwatch) may be achieved by a coil in the device inductively coupling to an output or "transmitting" coil in the external charging device. For example, the output coil of the external charging device may produce a magnetic field, which in turn induces a current in the "receiving" coil of the electronic device, and the induced current may be supplied to the device's battery to recharge the device's battery. Wireless charging, as described, may be particularly beneficial in small devices where conventional power connections are not feasible or otherwise occupy too much space, and/or to allow devices to be made smaller, thinner, and lighter by omitting power-cable connectors. As used herein, the term "wireless charging" may be used to refer to a battery charging operation that is facilitated by a wireless coupling (e.g., an inductive coupling) between an external device (e.g., a charger) and the electronic device being charged. For example, an output coil of the external device or charger may inductively couple with a coil of the electronic device being charged in order to supply power to the electronic device.

As described herein, the coil of an electronic device (e.g., the smartwatch) that is used to inductively couple to an output coil may also be used to produce a haptic output that is detectable or perceptible by a user of the device as a tactile sensation. In particular, the same coil that is used to supply current to a battery (or to a battery charging system or circuitry of the device) may form part of a haptic actuator. For example, in addition to acting as a receiving coil for wireless charging, the coil may operate as a coil of a haptic actuation system to produce haptic outputs. Using the same coil for both wireless battery charging and haptic output operations may help reduce the size and weight of devices, as a common component may be leveraged for multiple uses. As used herein, the term "haptic output" may be used to describe a vibration or impulse produced by the device that creates perceptible tactile sensation along one or more external surfaces of the device. A haptic output may be produced in order to provide tactile or haptic feedback to the user in response to a user input, an alert, a notification, or other triggering event.

While the foregoing example describes a smartwatch, the same or similar principles may apply to other devices as well. For example, a mobile phone or a tablet computer may include a coil to facilitate both wireless charging and haptic outputs. Other types of devices that may employ the concepts and techniques described herein include, without limitation, notebook computers, portable media players, computer peripherals (e.g., keyboard, mice, trackpads), headphones, earbuds (e.g., in-ear headphones or monitors), and styluses.

The coils used in conventional wireless charging systems may not be suitable for use in a haptic actuation system. For example, the positioning of magnets, ferromagnetic materials, or ferrite, which may be used as part of a haptic output system, when positioned proximate a conventional charging coil, may be detrimental to the operation of the charging system. For example, they may interfere with the inductive coupling between the output coil and the receiving coil of the wireless charging system, thereby reducing the efficiency and/or effectiveness of charging operations. Accordingly, as described herein, the battery charging system, the haptic output system, and the coil that is common to both systems may be configured to provide satisfactory battery charging as well as haptic output functions.

FIG. 1A depicts an example system having an example electronic device 100 and an external charging device 130 that is configured to wirelessly charge the electronic device 100. As described herein, the electronic device 100 may include a coil that is used by both a haptic output system and a wireless charging system of the electronic device 100. For example, the coil may be used to inductively couple to an output coil of the external charging device 130 such that the device 100 (and more particularly, a coil of the electronic device 100) wirelessly receives power from the charging device 130, and the coil of the electronic device 100 may in turn supply power (e.g., current) to a battery of the electronic device 100. The coil may also be used to produce a haptic output by, for example, producing an electromagnetic field that causes a movable mass of a haptic actuation system to move (e.g., vibrate).

The electronic device 100 may represent various different types of electronic devices that use a common coil for both wireless charging functions and haptic output functions. For example, the electronic device 100 may represent a watch (e.g., a smartwatch), a mobile phone (e.g., a smartphone), a tablet computer, a stylus, a notebook computer, a head-mounted display, headphones, earbuds, a charging case for earbuds or headphones, a digital media player (e.g., an mp3 player), or the like. Similarly, the external charging device 130 may represent various different types of charging devices that can wirelessly charge an electronic device, as described herein. For example, the external charging device 130 may represent a charging mat, a device dock or stand, an electronic device with built-in wireless charging functionality (e.g., a tablet computing system, a notebook or laptop computer, a mobile phone, an alarm clock), or the like.

In some cases, an electronic device 100 may be configured to be used with a corresponding external charging device 130 that has a complementary function to the electronic device 100. For example, where the electronic device 100 is a stylus, the external charging device 130 may be a tablet computer that receives or detects inputs from the stylus and can wirelessly charge the stylus. Other examples of device/charger pairs include a smartwatch and a charging dock, a set of earbuds and a charging case, a mobile phone and a notebook computer, and the like.

Figure 1B:
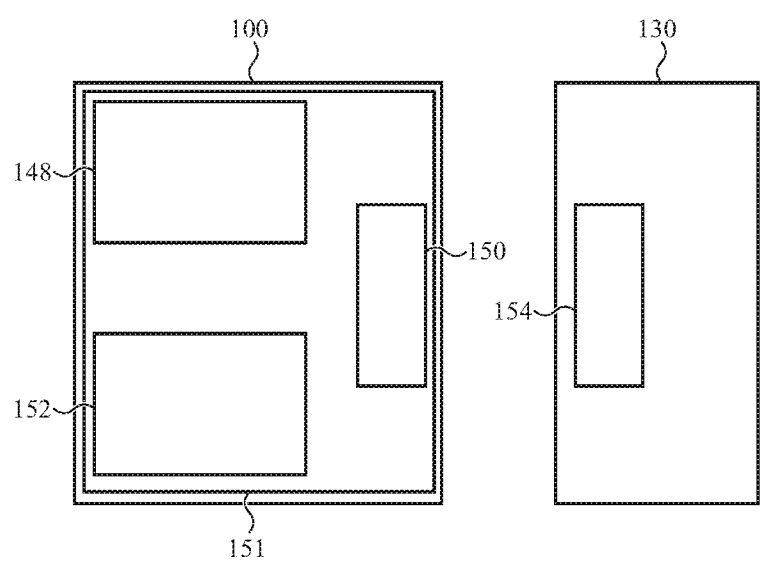

FIG. 1B depicts an example schematic view of the electronic device 100 and the external charging device 130, illustrating how a coil of the electronic device 100 may be used in different modes of operation. For example, the electronic device 100 may include a coil 150 within the electronic device 100. The coil 150 may be coupled to or otherwise integrated with a battery charging system 148 and to a haptic output system 152. The battery charging system 148, the haptic output system 152, and the coil 150 may be considered part of an integrated battery charging and haptic output system 151. The integrated battery charging and haptic output system 151 may include components, devices, software, firmware, processors, and the like, to facilitate wireless charging functionality and haptic output functionality for an electronic device, as described herein. Notably, the coil 150 may be shared by the battery charging system 148 (which may be described as a battery charging subsystem of the integrated battery charging and haptic output system 151) and the haptic output system 152 (which may be described a haptic output subsystem of the integrated battery charging and haptic output system 151). The battery charging subsystem and the haptic output subsystem may each have dedicated components, such as processors, memory, circuitry, and the like. In some cases, the battery charging subsystem and the haptic output subsystem may share such components (e.g., the device may include processors, memory, circuitry, or the like, that are shared by multiple systems and/or subsystems, such as the battery charging subsystem and the haptic output subsystem).

The coil 150 may provide different functions for the battery charging system 148 and the haptic output system 152. For example, in a battery charging mode, the coil 150 may be configured to inductively couple to an output coil 154 of the external charging device 130 in order to receive power from the output coil 154. In such cases, the coil 150 may operate in conjunction with the battery charging system 148 to supply power (e.g., electrical current) for charging the device's battery and/or power the device. As used herein, wirelessly receiving power refers to a condition whereby electrical current is induced by or within a component (e.g., an electronic device, a coil, a system, or other component), via a wireless means, from an external source. For example, power may be wirelessly received by a coil of an electronic device as a result of inductive coupling between an output coil (e.g., of an external wireless charger) and the coil of the electronic device.

In a haptic output mode, the coil 150 may operate in conjunction with the haptic output system 152 to cause, trigger, initiate, or otherwise produce a haptic output. For example, the coil 150 may be energized (e.g., from a battery of the device 100) in a manner that causes a haptic actuator component to produce a haptic output (e.g., via magnetic attraction, reluctance forces, Lorentz forces, or the like). Notably, the battery charging mode and the haptic actuation mode need not be mutually exclusive; rather, the modes may operate simultaneously or otherwise overlap (in time) in some circumstances.

Figure 1C:
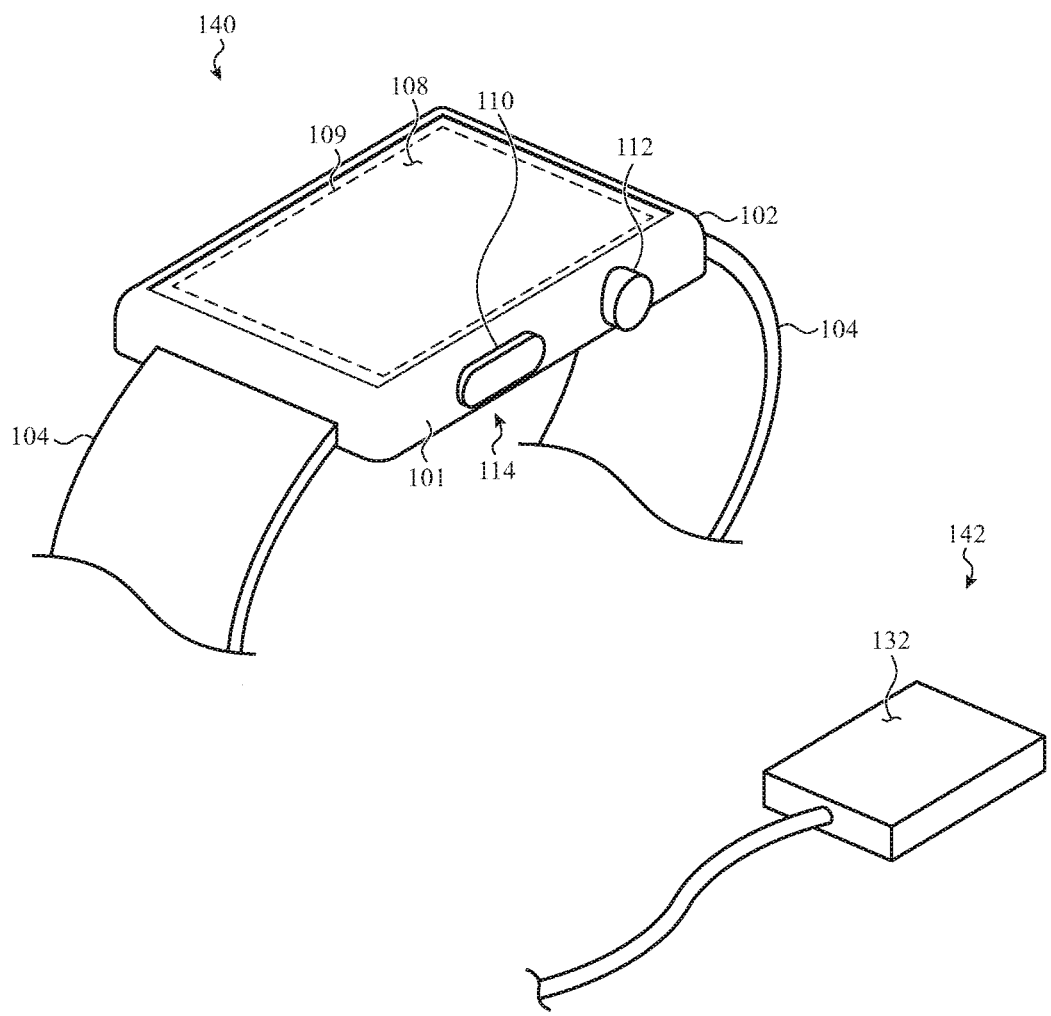
FIG. 1C depicts an example wearable electronic device.
Figure 1D:
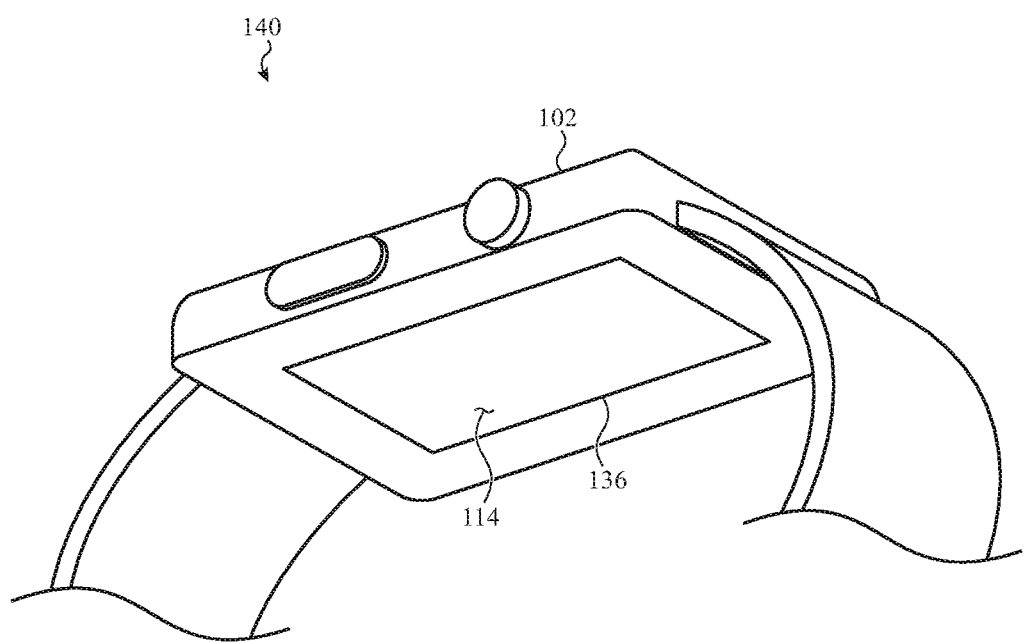
FIG. 1D depicts an alternative view of the wearable electronic device of FIG. 1C.

While FIGS. 1A-1B represent various different types of electronic devices and charging devices, FIGS. 1C-1D depict an example in which the electronic device 140 is a watch and the external charging device 142 (also referred to herein simply as a charger 142) is a dedicated charging device. As noted above, however, this is merely one example embodiment of an electronic device, and the concepts discussed herein may apply equally or by analogy to other electronic devices, including mobile phones (e.g., smartphones), tablet computers, styluses, notebook computers, head-mounted displays, headphones, earbuds, digital media players (e.g., mp3 players), or the like. The electronic device 140 may be an embodiment of the electronic device 100, and the external charging device 142 may be an embodiment of the external charging device 130.

The electronic device 140 includes a housing 102 and a band 104 coupled to the housing 102. The housing 102 may at least partially define an internal volume in which components of the device 140 may be positioned. The housing 102 may also define one or more exterior surfaces of the electronic device, such as all or a portion of one or more side surfaces, a rear surface, a front surface, and the like. The housing 102 may be formed of any suitable material, such as metal (e.g., aluminum, steel, titanium, or the like), ceramic, polymer, glass, or the like. The band 104 may be configured to attach the electronic device 140 to a user, such as to the user's arm or wrist. The electronic device 140 may include battery charging components within the housing 102, which may interact with the charger 142 (or other external charging device) to receive power, charge a battery of the device 140, and/or supply power to operate the device 140 regardless of the battery's state of charge (e.g., bypassing the battery of the device 140).

The external charging device 142, or charger 142, is an example of an external source of power that may be configured to wirelessly couple (e.g., via inductive coupling) to the electronic device 140 to provide power to the electronic device 140. The electronic device 140 may define a first charging surface 114 (e.g., along a rear side of the device opposite a front side or face of the device), and the charger 142 may define a second charging surface 132. When the electronic device 140 is placed on the charger 142 so that the first and second charging surfaces 114, 132 are in proximity to one another (e.g., in contact), a coil of the charger 142 may inductively couple with a coil of the electronic device 140 through the rear wall of the device 140. This may facilitate charging of the device 140 without having to plug a charging cable into a charging port of the device 140. This type of charging operation may be referred to herein as wireless charging of the device 140.

FIG. 1D shows a rear side of the device 140. The housing 102 includes a dielectric member 136 defining at least a portion of the rear surface of the device 140. A coil may be positioned within the housing 102 and proximate the dielectric member such that the coil may inductively couple to an output coil of the charger 142 to allow wireless charging of the device 140. The dielectric member 136 may define at least part of the charging surface 114, and may be formed of or include any suitable material(s), such as sapphire, polymer, ceramic, glass, or any other suitable material that allows or facilitates wireless charging.

The power received by the electronic device 140 may be used to charge the battery of the device 140 and otherwise provide power to the device 140. The charger 142 and electronic device 140 may also include an alignment system to help a user properly align the first and second charging surfaces 114, 132 when placing the device 140 on the charger. Suitable alignment systems may include magnets, complementary protrusions/recesses (or other complementary physical features), visual alignment indicators, or the like. While the charger 142 is shown as a rectangular puck-style charger, this is merely one example embodiment of an external charging device, and the concepts discussed herein may apply equally or by analogy to other external charging devices, including charging mats, docks, electronic devices with built-in wireless charging functionality (e.g., alarm clocks, another electronic device such as a mobile phone, notebook or laptop computing system, or tablet computing system), differently shaped chargers, or the like.

The electronic device 140 also includes a transparent cover 108 coupled to the housing 102. The cover 108 may define a front face of the electronic device 140. For example, in some cases, the cover 108 defines substantially the entire front face and/or front surface of the electronic device. The cover 108 may also define an input surface of the device 140. For example, as described herein, the device 140 may include touch and/or force sensors that detect inputs applied to the cover 108. The cover 108 may be formed from or include glass, sapphire, a polymer, a dielectric, or any other suitable material.

The cover 108 may cover (e.g., overlie) at least part of a display 109 that is positioned at least partially within the internal volume of the housing 102. The display 109 may define an output region in which graphical outputs are displayed. Graphical outputs may include graphical user interfaces, user interface elements (e.g., buttons, sliders, etc.), text, lists, photographs, videos, or the like. The display 109 may include a liquid crystal display (LCD), an organic light emitting diode display (OLED), or any other suitable components or display technologies.

The display 109 may include or be associated with touch sensors and/or force sensors that extend along the output region of the display and which may use any suitable sensing elements and/or sensing systems and/or techniques. Using touch sensors, the device 140 may detect touch inputs applied to the cover 108, including detecting locations of touch inputs, motions of touch inputs (e.g., the speed, direction, or other parameters of a gesture applied to the cover 108), or the like. Using force sensors, the device 140 may detect amounts or magnitudes of force associated with touch events applied to the cover 108. The touch and/or force sensors may detect various types of user inputs to control or modify the operation of the device, including taps, swipes, multi-finger inputs, single- or multi-finger touch gestures, presses, and the like. Further, as described herein, the touch and/or force sensors may detect motion of an object (e.g., a user's finger) as it is interacting with a crown 112 of the electronic device 140.

The device 140 may also be configured to produce haptic (e.g., tactile) outputs that are detectable by a wearer or user of the device 140. The device 140 may produce haptic outputs in various ways. For example, the device may include a movable mass that moves (e.g., oscillates or vibrates translationally and/or rotationally, or otherwise moves to produce a tactile output), which may be detectable by a user when the user is wearing or otherwise contacting (e.g., touching) the device 140. In other cases, the device may produce tactile outputs using other techniques, such as by imparting a force to a portion of the housing 102 that is movable relative to another portion of the housing. For example, a portion of the housing 102 that is in contact with a user when the device 140 is being worn may be moved (e.g., oscillated, translated, pivoted, rotated, etc.). The motion of the movable portion of the housing 102 may be perceived as a tactile output.

As described herein, haptic output functions and battery charging functions may be provided, in part, by shared components. For example, a coil within the electronic device 140 may be used to receive power during a wireless charging operation, and to produce haptic outputs during a haptic output operation. The coil may be used in various different types of haptic output systems. For example, the coil may be used in a Lorentz force actuator, a voice coil actuator, a solenoid, a reluctance force actuator, or any other suitable type of actuator using any suitable technique for producing force and/or motion for a haptic output.

Haptic outputs may be used at various times and in response to and/or in conjunction with various events associated with the device 140. For example, haptic outputs may be produced as an alert or notification, such as in response to the device 140 receiving a message (e.g., email, text message, etc.), the expiry of a timer or alarm, the detection of a health condition, an application triggering an alert or notification event, or the like. Haptic outputs may also or instead be produced in response to the device 140 receiving or detecting certain types of inputs, such as touch inputs applied to the cover 108, force inputs applied to the cover 108 (e.g., touch inputs having a force component satisfying a force threshold), inputs detected on input mechanisms such as buttons, crowns, dials, switches, or the like.

The electronic device 140 also includes a crown 112 (also referred to herein as a crown assembly) having a knob, external portion, or component(s) or feature(s) positioned along a side wall 101 of the housing 102. At least a portion of the crown 112 (e.g., a knob) may protrude from the housing 102, and may define a generally circular shape or a circular exterior surface. The exterior surface of the crown 112 (or a portion thereof) may be textured, knurled, grooved, or may otherwise have features that may improve the tactile feel of the crown 112 and/or facilitate rotation sensing.

The crown 112 may facilitate a variety of potential user interactions. For example, the crown 112 may be rotated by a user (e.g., the crown may receive rotational inputs). Rotational inputs to the crown 112 may zoom, scroll, rotate, or otherwise manipulate a user interface or other object displayed on the display 109 (among other possible functions). The crown 112 may also be translated or pressed (e.g., axially) by the user. Translational or axial inputs may select highlighted objects or icons, cause a user interface to return to a previous menu or display, or activate or deactivate functions (among other possible functions). In some cases, instead of a crown that is rotatable and translatable by a user, the crown may be configured not to rotate or translate relative to the housing 102, but may nevertheless be configured to detect user interactions that are similar to rotational and translational inputs. For example, the device 140 may sense, using touch sensors, force sensors, optical sensors, or the like, touch inputs or gestures applied to the crown 112. Such inputs may include a finger sliding along a surface of the crown 112, and a finger touching (or pressing on) an end face of the crown 112. In such cases, sliding gestures may cause operations similar to the rotational inputs, and touches (or presses) on an end face may cause operations similar to the translational inputs. As used herein, rotational inputs may include both rotational movements of the crown (e.g., where the crown is free to rotate), as well as sliding inputs that are produced when a user slides a finger or object along the surface of a crown in a manner that resembles a rotation (e.g., where the crown is fixed and/or does not freely rotate). In some cases, as noted above, haptic outputs may be produced in response to the detection of certain types of inputs applied to the crown 112. For example, a haptic output may be produced in response to detection of a particular rotational input (e.g., a partial rotation, such as 10° rotation, 20° rotation, 30° rotation, or any other suitable rotation), a translational input, or the like. In the case of crowns that are configured not to rotate or translate relative to a housing, a haptic output may be produced in response to detection of a sliding input applied to a surface of the crown, a touch input on an axial end of the crown, or a force (applied to the axial end of the crown) that satisfies a condition (e.g., exceeds a predetermined force corresponding to an actuation threshold).

The electronic device 140 may also include other inputs, switches, buttons, or the like. For example, the electronic device 140 includes a button 110. The button 110 may be a movable button (as depicted) or a touch-sensitive region of the housing 102. The button 110 may control various aspects of the electronic device 140. For example, the button 110 may be used to select icons, items, or other objects displayed on the display 109, to activate or deactivate functions (e.g., to silence an alarm or alert), or the like. As noted above, a haptic output may be produced in response to detection of an input applied to the button 110 (or indeed any other input device or system associated with the device 140).

As noted above, a coil in an electronic device may be used to perform different functions in different modes of the device, or during different operations of the device. For example, a coil in a device may be used to receive power during a battery charging operation, and to interact with components of a haptic output system during a haptic output operation.

Figure 2A:
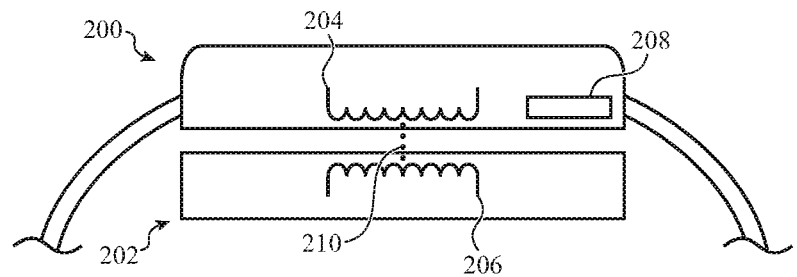
FIG. 2A depicts an example electronic device in a first mode of operation.
Figure 2B:
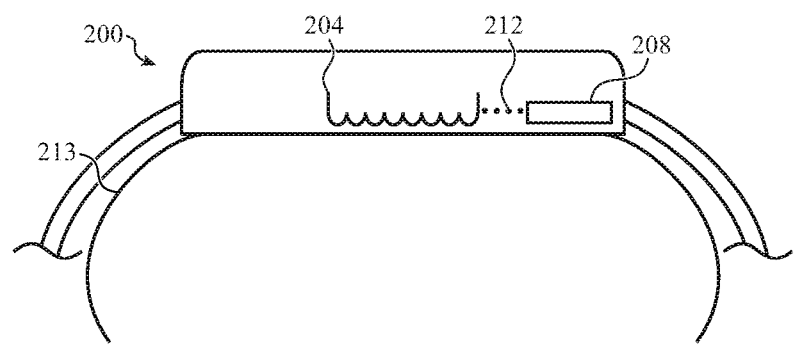
FIG. 2B depicts the example electronic device of FIG. 2A in a second mode of operation.
Figure 2C:
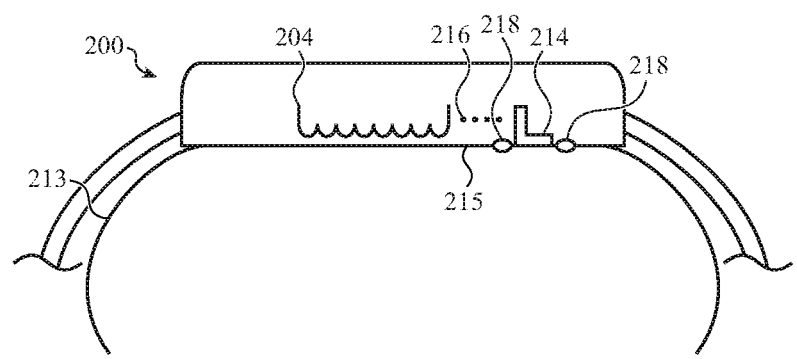
FIG. 2C depicts an example electronic device having a movable housing component for haptic outputs.

FIGS. 2A-2C depict example schematic views of an electronic device (in this case a smartwatch), illustrating how a coil may be used in different modes of operation. FIG. 2A illustrates the device 200 during a wireless battery charging operation (e.g., while the device 200 is in a charging mode). The device 200 (which may be an embodiment of or similar to the device 140, FIG. 1C) is positioned in proximity to a charger 202 (which may be an embodiment of the charger 142, FIG. 1C). For example, the device 200 may be placed in contact with the charger 202 so that a coil 204 of the device 200 is sufficiently aligned with an output coil 206 of the charger 202 to allow power transfer from the output coil 206 to the coil 204. The charger 202 may be coupled to a power supply (e.g., an outlet, a battery, etc.) via a power cable. As shown in FIG. 2A, the coils 204, 206 are inductively coupled (represented by dotted line 210), illustrating power being transferred from the output coil 206 to the coil 204.

The device 200 also includes a haptic component 208. The haptic component 208 may be any suitable component or part of a haptic output system with which the coil may electrically, magnetically, or otherwise interact to produce a haptic output. For example, the haptic component 208 may be a movable mass, a magnet, a ferromagnetic element, or any other suitable component or material. As described herein, in some cases a movable mass may be secured, stowed, or otherwise configured to remain stationary when the device 200 is in a charging mode and/or during a battery charging operation.

FIG. 2B illustrates the device 200 during a haptic output operation. As shown, the device 200 is being worn on an arm 213 of a user, though this need not be the case as a haptic output operation may be performed at any time (including, in some implementations, during a battery charging operation) and/or when the device 200 is not being worn by a user. In order to produce a haptic output, the coil 204 may interact with the haptic component 208, as illustrated by dotted line 212. For example, the haptic component 208 may be a movable magnet, and the coil 204 may be supplied with a drive signal to produce a magnetic field that attracts and/or repels the movable magnet to produce an oscillation, vibration, pulse, or the like, that results in a tactile output. (In some cases, the movable magnet may also function as part of an alignment system to help align the device 200 relative to another device such as a charger.) Where the haptic component 208 is a movable magnet, the movable magnet may be rendered stationary during a battery charging operation, but may be movable during a haptic mode or haptic operation. As another example, the haptic component 208 may be a stationary magnet, and when the coil 204 is supplied with a drive signal (e.g., an AC current or other electrical signal and/or waveform is passed through the coil 204 and/or received by the coil 204), the coil 204 may move as a result of magnetic interaction with the stationary magnet (or as a result of Lorentz forces acting on the coil 204). Other techniques for producing a haptic output are described with respect to FIGS. 4A-7B.

FIG. 2B illustrates an example in which a mass inside the device 200 moves to produce a haptic output. The mass may be a movable mass that is separate from the coil, or it may be the coil itself or attached to the coil. The moving mass may ultimately cause the whole device housing to move. This motion may be detected by a user as a vibration, pulse, oscillation, or other tactile output. In other cases, haptic outputs may be produced in other ways. FIG. 2C, for example, illustrates the device 200 during a haptic output operation, where the haptic output is produced by moving a portion of a device housing relative to another, main portion of the housing, where the moved portion is in contact with the user's skin. For example, in the embodiment shown in FIG. 2C, the device 200 includes the coil 204 and a contact member 214 (e.g., a second portion of a housing) that is configured to move relative to a remainder of the housing (e.g., a first portion 215 of the housing). The contact member 214 (which may define an exterior surface of the housing of the device) may be coupled to another portion of the housing (e.g., the first portion 215) via one or more compliant members 218 that allow the contact member 214 to move relative to the other portion of the housing while retaining the contact member 214 to the housing and preventing ingress of liquid or other contaminants. The one or more compliant members 218 may be formed of or include rubber, elastomer, polymer, or other compliant material(s).

In order to produce a haptic output, the coil 204 may interact with the contact member 214 or a component coupled to or associated with the contact member 214, as illustrated by dotted line 216, to cause the contact member 214 to move. As shown, the contact member 214 may be positioned on the device so that it is in contact with the user's skin when the device is being worn or handled. Accordingly, the user may perceive the motion of the contact member 214 as a haptic or tactile output. The coil 204 may cause the contact member 214 to move using any suitable technique, including magnetic attraction, reluctance forces, Lorentz forces, or the like.

As described above, a device with a coil may use the coil for multiple purposes and/or functions, such as to charge the device and to produce haptic outputs. FIGS. 3A-9 depict various example implementations for using a single coil or coil assembly for both haptic output functions and a battery charging functions.

Figure 3A:
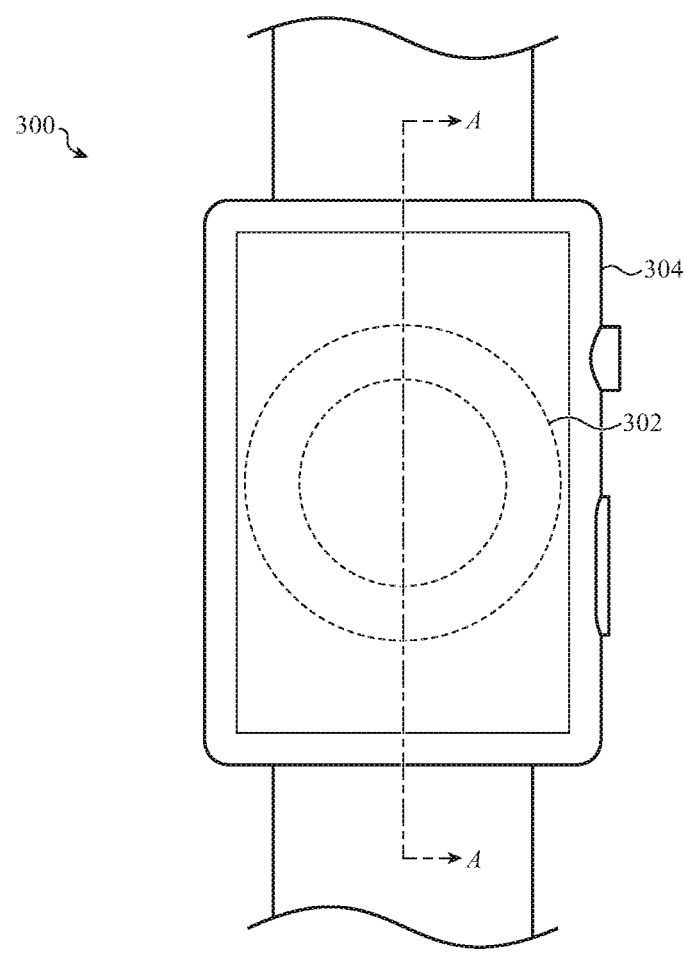
FIG. 3A depicts another example wearable electronic device.

FIG. 3A depicts an example device 300 with a coil 302 positioned at least partially within a housing 304. The device 300 may be an embodiment of or similar to the device 140, described with respect to FIG. 1C. Accordingly, details of the device 140 described above, including components, structures, uses, functions, etc., may apply to the device 300, and for brevity will not be repeated here.

Figure 3B:
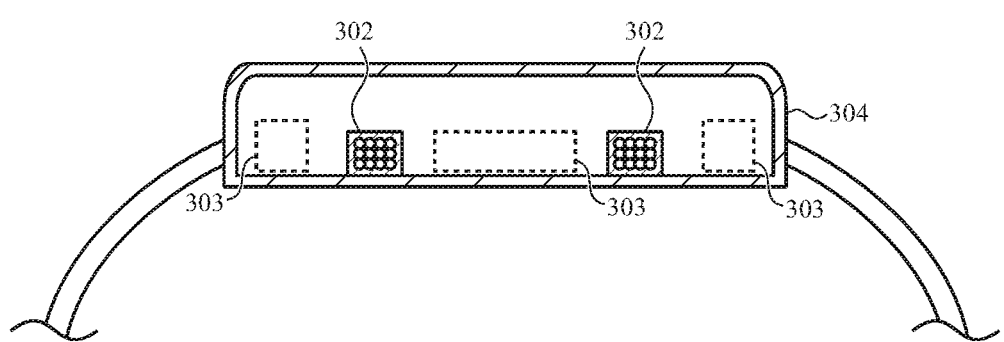
FIG. 3B depicts a partial cross-sectional view of the wearable electronic device of FIG. 3A.

FIG. 3B is a partial cross-sectional view of the device 300, viewed along line A-A in FIG. 3A. Internal components of the device 300 are omitted from FIG. 3B for clarity, but may include components such as batteries, circuit boards, processors, displays, sensors, speakers, or the like. Further, some components of a haptic output system, such as armatures, mounting structures, springs or other compliant members, etc., are omitted from FIG. 3B for clarity.

The coil 302 may include multiple turns of a wire or other conductor, and may be positioned proximate a rear wall of the housing 304. The rear wall of the housing 304 may define a charging surface of the device 300, as described above. As shown, the coil 302 is a circular component that has a central axis (e.g., an axis about which the coil is wrapped) that is perpendicular to the front surface of the device 300 (e.g., a plane defining a front cover of the device). In other embodiments, however, the coil may have a different position or configuration. For example, a coil may have a central axis that is parallel with or otherwise not perpendicular to the front surface of the device 300. Further, a diameter of the coil may be smaller than the coil 302 shown in FIGS. 3A-3B. In some cases, the shape of the coil and the position and/or orientation of the coil within the housing 304 may depend at least in part on how the coil is integrated with or interacts with other components of a haptic output system and/or a battery charging system of the device.

The device 300 may also include components 303 with which the coil 302 may interact to provide haptic and/or charging functions. The components 303 may be or may include magnets, ferromagnetic materials, movable masses, selectively constrainable masses, armatures, and the like. Examples of such components and their functions and configurations are described in greater detail herein.

Figure 4A:
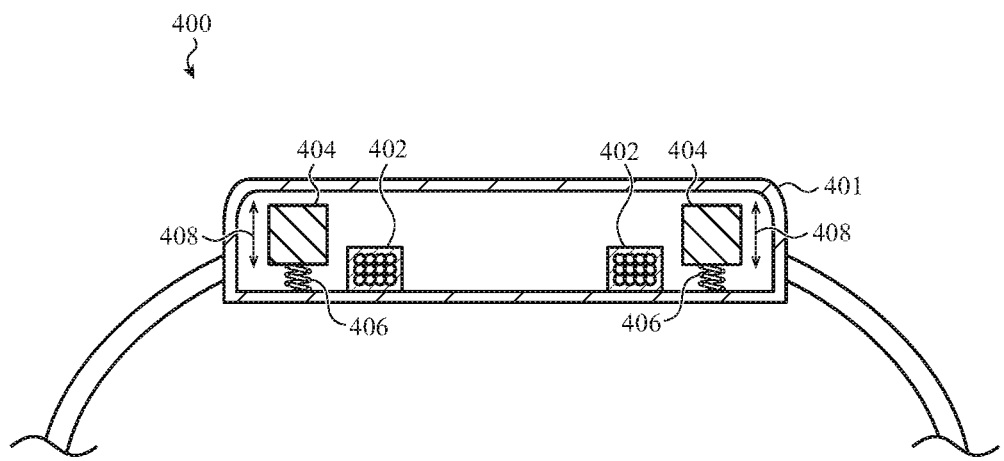
FIG. 4A depicts a partial cross-sectional view of another wearable electronic device having a movable mass.

FIG. 4A illustrates a partial cross-sectional view of an example device 400. The device includes a housing 401 and a coil 402 at least partially within the housing 401. The device 400 may be an embodiment of or similar to other devices described herein (e.g., the device 140), and as such details of the devices described herein, including components, structures, uses, functions, etc., may apply to the device 400, and for brevity will not be repeated here. Similarly, the coil 402 may be an embodiment of or similar to other coils described herein (e.g., the coil 302), and for brevity details of those coils will not be repeated here. For example, the coil 402 may be configured to provide power to charge a battery of the device (and otherwise power the device).

The device 400 includes a movable mass 404. The movable mass 404 may produce a haptic output as a result of an interaction with a coil. For example, the movable mass 404 may be movably coupled to the housing 401 via a compliant coupling 406. The compliant coupling 406 may be a spring (e.g., coil spring, leaf spring, etc.), an elastomeric member, a compliant material, a linkage, or any other suitable material and/or mechanism that allows the movable mass 404 to move relative to the housing 401. In some cases, the compliant coupling 406 also provides a returning and/or centering force to the movable mass 404.

The movable mass 404 may be a ring-shaped component or structure, and may have a shape similar to the shape of the coil 302 in FIGS. 3A-3B. In some cases the movable mass 404 extends around an outer perimeter of the coil 402 (e.g., surrounding the coil 402), as shown in FIG. 4A.

The movable mass 404 may be or may include a material or component that electromagnetically interacts with the coil 402 to cause the movable mass 404 to move. For example, the movable mass 404 may be or may include a permanent magnet. The permanent magnet may produce a magnetic field, and the coil 402 may be positioned in at least a portion of the magnetic field. In this example, motion of the movable mass 404 may be produced by passing current through the coil 402. In particular, passing current through the coil 402 while the coil 402 is in the presence of the magnetic field from the permanent magnet may produce Lorentz forces on the windings of the coil 402. The presence of the Lorentz forces in the magnetic field may oppose or otherwise interact with the magnetic field to produce a force on the permanent magnet. This may cause the movable mass 404, and more particularly the permanent magnet that is the movable mass 404 or is part of the movable mass 404, to move (as illustrated by arrows 408). The motion of the movable mass 404 may be any suitable motion, such as an oscillation, a pulse, a waveform, an audio signal (e.g., a haptic motion corresponding to an audio signal such as a song or series of musical notes), or the like. In some cases, the particular motion of the movable mass 404 is determined by the characteristics of the current that is passed through the coil 402. For example, a sinusoidal alternating current may produce a sinusoidal oscillating motion of the movable mass 404.

Figure 4B:
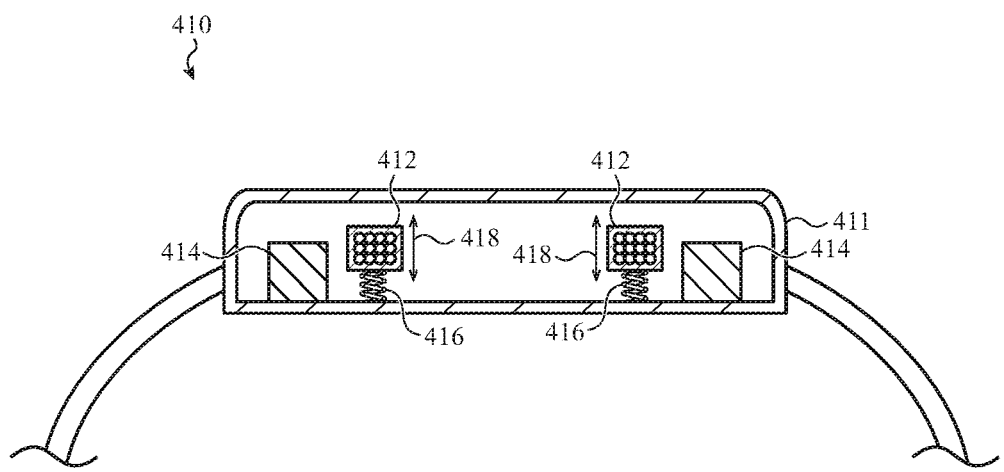
FIG. 4B depicts a partial cross-sectional view of an example wearable electronic device having a movable coil.

FIG. 4B illustrates a partial cross-sectional view of an example device 410. The device 410 includes a housing 411 and a coil 412 at least partially within the housing 411. The device 410 may be an embodiment of or similar to other devices described herein (e.g., the device 140), and as such details of the devices described herein, including components, structures, uses, functions, etc., may apply to the device 410, and for brevity will not be repeated here. Similarly, the coil 412 may be an embodiment of or similar to other coils described herein (e.g., the coil 302), and for brevity details of those coils will not be repeated here. For example, the coil 412 may be configured to provide power to charge a battery of the device (and otherwise power the device).

The device 410 includes a permanent magnet 414. The permanent magnet 414 may be the same as or similar to the permanent magnet described with respect to FIG. 4A, but instead of being movable relative to the housing 411, it may be substantially fixed relative to the housing 411. Instead, the coil 412 may be movable relative to the housing 411. For example, the coil 412 may be movably coupled to the housing 411 via a compliant coupling 416, which may be or may include a spring (e.g., coil spring, leaf spring, etc.), an elastomeric member, a compliant material, a linkage, or any other suitable material and/or mechanism that allows the coil 412 to move relative to the housing 411. In some cases, the compliant coupling 416 also provides a returning and/or centering force to the coil 412.

The movable coil 412 may produce a haptic output as a result of an interaction with the magnetic field of the permanent magnet 414. For example, when a haptic output is requested by the device, a current may be passed through the coil 412. Because the coil 412 is in a magnetic field produced by the permanent magnet 414, the passing of current through the coil 412 may produce Lorentz forces on the windings of the coil 412. These forces may cause the coil 412 to move, as illustrated by arrows 418. The motion of the coil 412 may be any suitable motion, such as an oscillation, a pulse, a waveform (e.g., corresponding to an audio signal such as a song or series of musical notes), or the like. In some cases, the particular motion of the coil 412 is determined by the characteristics of the current that is passed through the coil 412. For example, a sinusoidal alternating current may produce a sinusoidal oscillating motion of the coil 412. In some cases, the coil 412 itself may not have sufficient mass to produce a detectable or sufficiently strong tactile output. Accordingly, in some cases additional mass is coupled to the coil 412 to increase the inertia of the movable components. The increased inertia of the movable components (e.g., the coil and the added mass, such as a metal, ceramic, glass, plastic, or other added material) may increase the strength of the haptic output as perceived by a wearer.

Figure 5A:
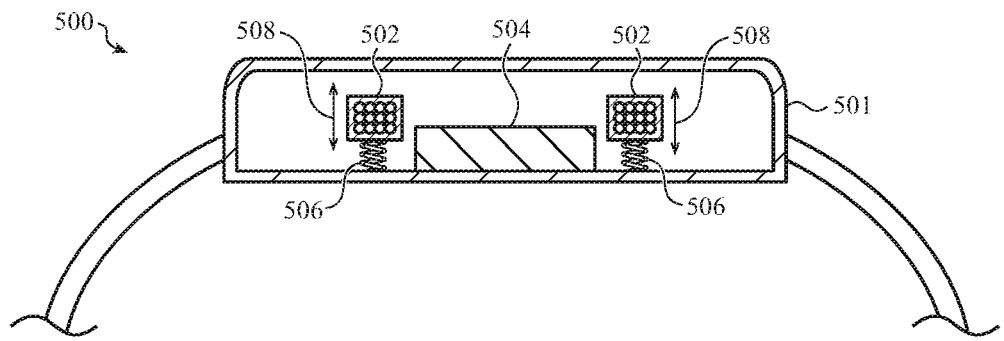
FIG. 5A depicts a partial cross-sectional view of an example wearable electronic device having a movable coil.

FIG. 5A illustrates a partial cross-sectional view of an example device 500. The device 500 includes a housing 501 and a coil 502 at least partially within the housing 501. The device 500 may be an embodiment of or similar to other devices described herein (e.g., the device 140), and as such details of the devices described herein, including components, structures, uses, functions, etc., may apply to the device 500, and for brevity will not be repeated here. Similarly, the coil 502 may be an embodiment of or similar to other coils described herein (e.g., the coil 302), and for brevity details of those coils will not be repeated here. For example, the coil 502 may be configured to provide power to charge a battery of the device (and otherwise power the device).

The device 500 includes an actuator component 504. The actuator component 504 may be positioned at least partially within a central area defined by the coil 502 (e.g., a central area about which the coils are wrapped, or the inside of the "ring" defined by the coil 502). In some cases, the actuator component 504 is circular and a center of the circular actuator component 504 may be aligned with a central axis of the coil 502. In some cases, a substantially continuous or uniform gap may be defined between an outer perimeter of the actuator component 504 and an inner side of the coil 502.

The actuator component 504 may be or may include a permanent magnet, or it may include a ferromagnetic element (e.g., formed of or including ferromagnetic material) that does not produce a magnetic field absent the influence of another magnetic field (e.g., an unmagnetized steel, ferrite, iron, or other suitable material). The type of material used for the actuator component 504 may depend on various factors, such as the particular electromagnetic interaction that the haptic output system uses to produce the haptic output.

The coil 502 in the device 500 may be movable relative to the housing 501. For example, the coil 502 may be movably coupled to the housing 501 via a compliant coupling 506, which may be or may include a spring (e.g., coil spring, leaf spring, etc.), an elastomeric member, a compliant material, a linkage, or any other suitable material and/or mechanism that allows the coil 502 to move relative to the housing 501. In some cases, the compliant coupling 506 also provides a returning and/or centering force to the coil 502.

The movable coil 502 may produce a haptic output as a result of a magnetic and/or electromagnetic interaction with the actuator component 504. For example, when a haptic output is requested by the device, a current may be passed through the coil 502, thereby causing the coil 502 to produce a magnetic field. In cases where the actuator component 504 is or includes a permanent magnet, the interaction between the magnetic fields (and/or magnetic poles) of the coil 502 and the permanent magnet may produce a magnetic attraction and/or repulsion between the coil 502 and the actuator component 504. In cases where the actuator component 504 is or includes an unmagnetized ferromagnetic material, the interaction between the magnetic field produced by the coil 502 and the unmagnetized ferromagnetic material may cause the coil 502 and the actuator component 504 to attract and/or repel one another. Such attraction and repulsion forces may be a result of magnetic attraction and/or repulsion (e.g., a north pole of a magnet or magnetic field being attracted to a south pole of another magnet or magnetic field), a result of a reluctance force (e.g., a phenomenon in which the electromagnetic system that includes the actuator component 504 and the coil 502 are forced towards a magnetically aligned condition), or as a result of any other electromagnetic principle or property.

The attraction and/or repulsion between the coil 502 (when supplied with a drive signal) and the actuator component 504 causes the coil 502 to move relative to the housing 501 (as indicated by arrows 508), thereby producing a haptic output. Current may be passed through the coil repeatedly or cyclically to produce a prolonged oscillation or vibration. In some cases, a single pulse of current may cause the coil 502 to move in one direction, and the coil 502 may oscillate multiple times due to the spring effect of the compliant coupling 506 (e.g., a ring-down effect), which may produce a vibration or oscillation without requiring application of an oscillating or repeating current to the coil 502.

Figure 5B:
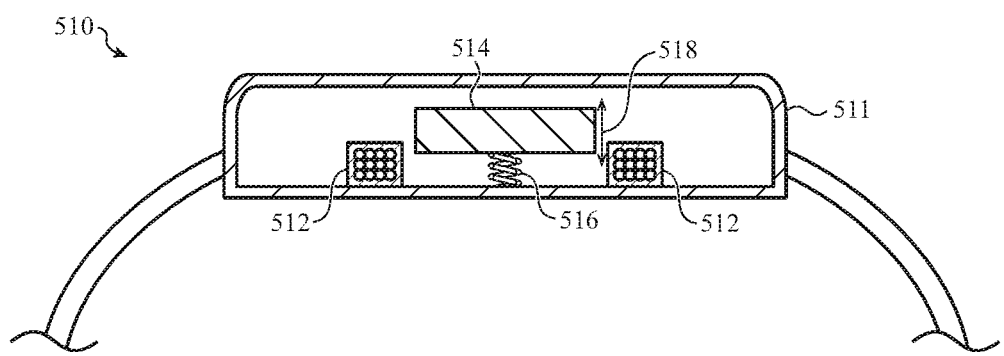
FIG. 5B depicts a partial cross-sectional view of an example wearable electronic device having a movable mass.

FIG. 5B illustrates a partial cross-sectional view of an example device 510. The device 510 includes a housing 511 and a coil 512 at least partially within the housing 511. The device 510 may be an embodiment of or similar to other devices described herein (e.g., the device 140), and as such details of the devices described herein, including components, structures, uses, functions, etc., may apply to the device 510, and for brevity will not be repeated here. Similarly, the coil 512 may be an embodiment of or similar to other coils described herein (e.g., the coil 302), and for brevity details of those coils will not be repeated here. For example, the coil 512 may be configured to provide power to charge a battery of the device (and otherwise power the device).

The device 510 includes an actuator component 514. The actuator component 514 and the coil 512 may be the same as or similar to the corresponding actuator component 504 and coil 502 in FIG. 5A, except that instead of the coil 502 being movable relative to the housing, the actuator component 514 is movable relative to the housing 511. For example, the actuator component 514 may be movably coupled to the housing 511 via a compliant coupling 516, which may be or may include a spring (e.g., coil spring, leaf spring, etc.), an elastomeric member, a compliant material, a linkage, or any other suitable material and/or mechanism that allows the actuator component 514 to move relative to the housing 511. In some cases, the compliant coupling 516 also provides a returning and/or centering force to the actuator component 514.

The electromagnetic principles and/or properties that are used to produce a haptic output in the device 500 may also be at play in the device 510. For example, when a current is passed through the coil 512, electromagnetic interaction between the coil 512 and the actuator component 514 may result in a force that causes the movable actuator component 514 to move relative to the housing 501 (as indicated by arrows 518), thereby producing a haptic output.

Figure 6:
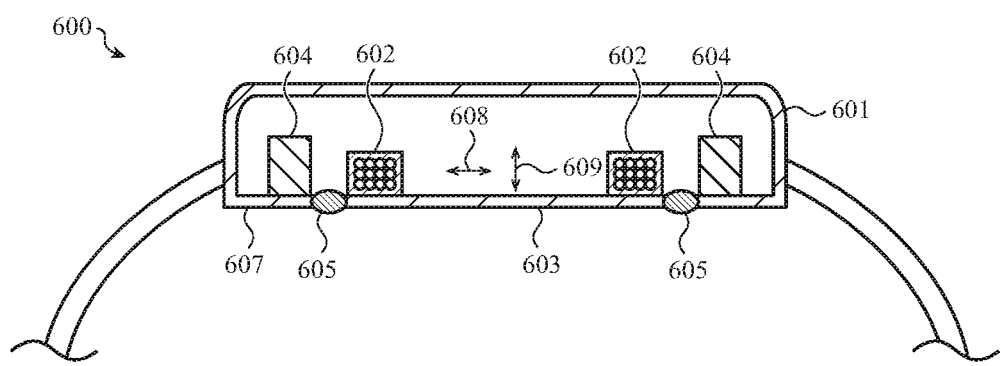
FIG. 6 depicts a partial cross-sectional view of an example wearable electronic device having a movable housing member.

FIG. 6 illustrates a partial cross-sectional view of an example device 600. The device 600 includes a housing 601 and a coil 602 at least partially within the housing 601. The device 600 may be an embodiment of or similar to other devices described herein (e.g., the device 140), and as such details of the devices described herein, including components, structures, uses, functions, etc., may apply to the device 600, and for brevity will not be repeated here. Similarly, the coil 602 may be an embodiment of or similar to other coils described herein (e.g., the coil 302), and for brevity details of those coils will not be repeated here. For example, the coil 602 may be configured to provide power to charge a battery of the device (and otherwise power the device).

The housing 601 may include a contact member 603 (which may be a second housing member) that defines an exterior surface of the housing 601 and is movable relative to a first housing member 607 of the housing 601. The contact member 603 may be coupled to the first housing member 607 via a compliant coupling 605. The compliant coupling 605 may be any suitable material, component, or assembly that retains the contact member 603 to the first housing member 607 of the housing 601 while allowing the contact member 603 to move to produce a haptic output.

The contact member 603 may be positioned so that it is likely to be in contact with a user when the device 600 is being used. For example, FIG. 6 shows the device 600 as a watch, and the contact member 603 defines a rear side of the watch that would be in contact with a user's skin when the watch is being worn on a user's wrist. The contact member 603 may be moved by a haptic output system of the device 600, and the movement of the contact member 603 against the user's skin may produce a haptic output which can be perceived by the user.

The contact member 603 may be moved as a result of an interaction between the coil 602 and an actuator component 604. For example, a current may be passed through the coil 602 resulting in an electromagnetic interaction with the actuator component 604. For example, where the actuator component 604 is a permanent magnet, a current through the coil 602 may result in Lorentz forces acting on the coil 602, which in turn may cause the contact member 603 to move relative to the first housing member 607 of the housing 601. In other cases, the actuator component 604 may be an unmagnetized ferromagnetic material, and the force that moves the contact member 603 may be the result of other electromagnetic interactions between the actuator component 604 and the coil 602. Indeed, motion of the contact member 603 may be produced as a result of any suitable type of electromagnetic interaction or electromagnetic principle (e.g., reluctance forces, magnetic attraction/repulsion, or the like).

The contact member 603 may move in any suitable direction to produce the haptic output. For example, the contact member 603 may move substantially parallel to a plane defined by an exterior surface of the contact member 603, as indicated by arrow 608. In another example, the contact member 603 may move substantially perpendicular to the plane defined by the contact member 603, as indicated by arrow 609. Other directions or motions may also be used. For example, the contact member 603 may rotate about a pivot axis. In some cases, the pivot axis may extend substantially parallel to the plane defined by the exterior surface of the contact member 603 such that a left side of the contact member 603 moves downward and a right side of the contact member 603 moves upwards (with the directions being relative to the particular orientation shown in FIG. 6). In other cases, the pivot axis may extend perpendicular to the plane defined by the exterior surface of the contact member 603, such that the motion of the contact member 603 may be a twisting motion that occurs substantially in-plane with respect to the exterior surface of the contact member 603. It will be understood that these types of motions may be applied to contact members 603 that have other shapes and/or configurations, such as contact members 603 that do not have planar exterior surfaces (e.g., having curved convex surfaces, or the like).

Figure 7A:
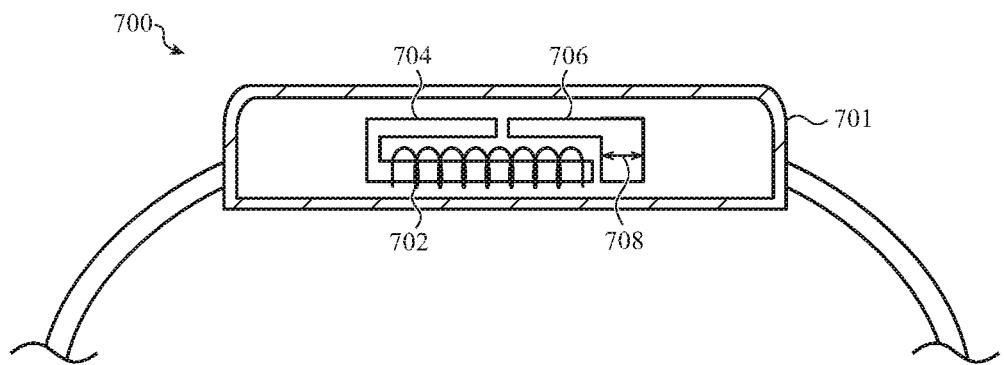
FIG. 7A depicts a partial cross-sectional view of an example wearable electronic device having a reluctance force actuator.

FIGS. 3A-6 illustrate example devices in which a coil has a central axis that extends substantially perpendicular to a face of the devices. Other coil configurations are also contemplated, however. For example, FIG. 7A illustrates a partial cross-sectional view of an example device 700. The device 700 includes a housing 701 and a coil 702 at least partially within the housing 701. The device 700 may be an embodiment of or similar to other devices described herein (e.g., the device 140), and as such details of the devices described herein, including components, structures, uses, functions, etc., may apply to the device 700, and for brevity will not be repeated here. As shown in FIG. 7A, the coil 702 has a central axis that extends parallel to the face of the device 700.

The coil 702 may be configured to inductively couple with another coil to charge a battery of the device 700. Like the other coils described herein, the coil 702 may also interact with other components of the device to produce haptic outputs. For example, as shown in FIG. 7A, the coil 702 may be wrapped about a portion of a first armature component 704. The first armature component 704 may be fixed relative to the housing 701 (e.g., adhered, attached via non-compliant fastener(s), etc.). A second armature component 706 may be positioned proximate the first armature component 704, but separated by a gap (e.g., an air gap). The second armature component 706 may be movable relative to the first armature component 704 (and thus movable relative to the housing 701). When a haptic output is required, a current may be passed through the coil 702, which in turn produces a reluctance force tending to close or reduce the gap between the first and second armature components 704, 706. Because the second armature component 706 is movable, this may cause the second armature component 706 to move as indicated by arrows 708. In some cases, the first armature component 704 may be movable relative to the housing 701 and the second armature component 706 may be fixed relative to the housing 701, and in other cases both armature components 704, 706 may be movable to produce the haptic output.

The movable armature component(s), such as the second armature component 706, may be coupled to the housing 701 or to any other suitable component of the device 700 via a compliant coupling, such as a spring (e.g., coil spring, leaf spring, etc.), an elastomeric member, a compliant material, a linkage, or any other suitable material and/or mechanism that allows the second armature component 706 (or any movable armature component) to move relative to the housing 701, and also provide a returning and/or centering force to the second armature component 706. Like the other devices described herein, the haptic output may result from any suitable motion of the second armature component 706, such as an oscillation (e.g., a sustained, repetitive motion), a pulse (e.g., an impulse in a single direction, with or without a subsequent ring-down), or the like.

Figure 7B:
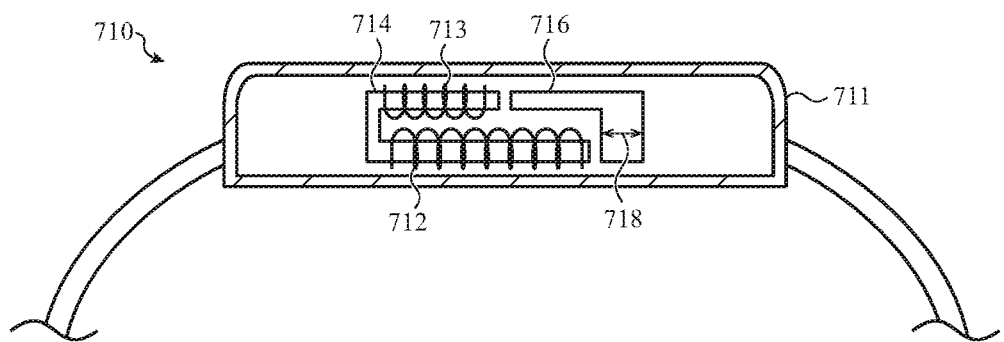
FIG. 7B depicts a partial cross-sectional view of another example wearable electronic device having a reluctance force actuator.

In some cases, a coil that is configured for wireless charging functions (e.g., to inductively couple with an output coil in order to wirelessly receive power) may not be optimal for producing haptic outputs. In such cases, multiple coils may be used in a device to provide adequate charging and haptic output functions. FIG. 7B illustrates a partial cross-sectional view of an example device 710 that includes multiple coils. The device 710 includes a housing 711, and a first coil 712 and a second coil 713 at least partially within the housing 711. The device 710 may be an embodiment of or similar to other devices described herein (e.g., the device 140), and as such details of the devices described herein, including components, structures, uses, functions, etc., may apply to the device 710, and for brevity will not be repeated here. As shown in FIG. 7B, both the first and second coils 712, 713 have central axes that extend parallel to the face of the device 710.

The first and second coils 712, 713 may be used in various ways and in various combinations to provide both charging and haptic output functions. For example, in some cases only one of the coils is used for wireless charging functions while both coils are used for producing haptic outputs. For example, when the device 710 is charging, the first coil 712 may inductively couple to an output coil of a charger to receive power and charge a battery of the device 710 (and the second coil 713 may be inactive, disconnected, or otherwise not involved in the wireless charging operation). In order to produce a haptic output, both the first coil 712 and the second coil 713 may receive a drive signal (e.g., a current) from the battery, which in turn produces a reluctance force tending to close or reduce a gap between first and second armature components 714, 716 (resulting in motion of the second armature component 716 as indicated by arrows 718, for example). In some cases, both the first and second coils 712, 713 are used for wireless charging functions (e.g., they may both be configured to inductively couple to a charger).

The first and second coils 712, 713 may be the same, or they may have different properties. For example, the first coil 712 may have more or fewer windings than the second coil 713, may be a different material than the second coil 713, or the like. Apart from the coil configurations, the device 710 may be the same as or similar to the device 710.

For devices that include movable masses that are used to produce haptic outputs (e.g., by vibrating, oscillating, pulsing, or the like), it may not be desirable to allow the mass to move at all times. For example, during a wireless charging operation or mode, the movable mass may be exposed to magnetic fields as a result of a coil inductively coupling to an output coil of a charger. These magnetic fields (or other electromagnetic phenomenon) may cause the movable mass to move, which produce undesirable vibrations, oscillations, sounds, or the like. Accordingly, in some cases a device may include a retention system that constrains movement of the movable mass during certain modes of operation, such as when the device is being charged.

Figure 8A:
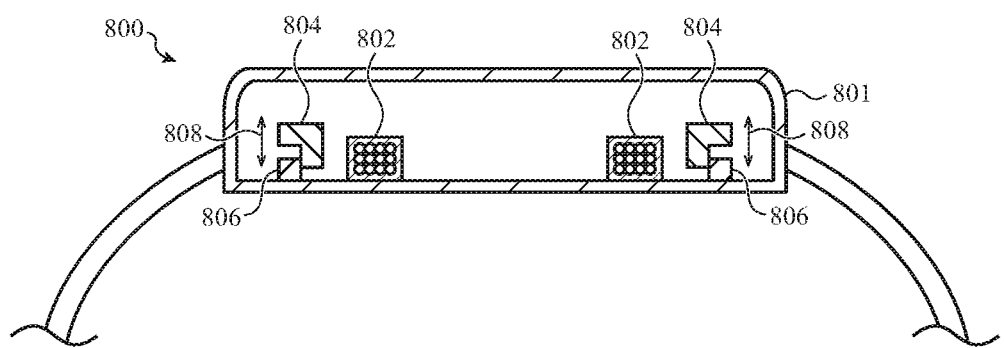
FIG. 8A depicts a partial cross-sectional view of an example wearable electronic device in a first mode of operation.

FIG. 8A illustrates a partial cross-sectional view of an example device 800 that includes a retention system for selectively constraining or securing a movable mass. The device 800 includes a housing 801 and a coil 802 at least partially within the housing 801. The device 800 also includes a movable mass 804 that is configured to move in response to the coil 802 receiving a suitable drive signal or current, as well as a retention system 806. The device 800 may be an embodiment of or similar to other devices described herein (e.g., the device 140), and as such details of the devices described herein, including components, structures, uses, functions, etc., may apply to the device 800, and for brevity will not be repeated here.

FIG. 8A shows the device 800 in a first mode of operation in which the movable mass 804 is not constrained or secured by the retention system 806. In this mode, which may correspond to a haptic output mode or a mode in which the coil 802 is not being used to charge the battery of the device, the coil 802 may be energized or provided with a drive signal, which in turn causes the movable mass 804 to move, as indicated by arrows 808.

Figure 8B:
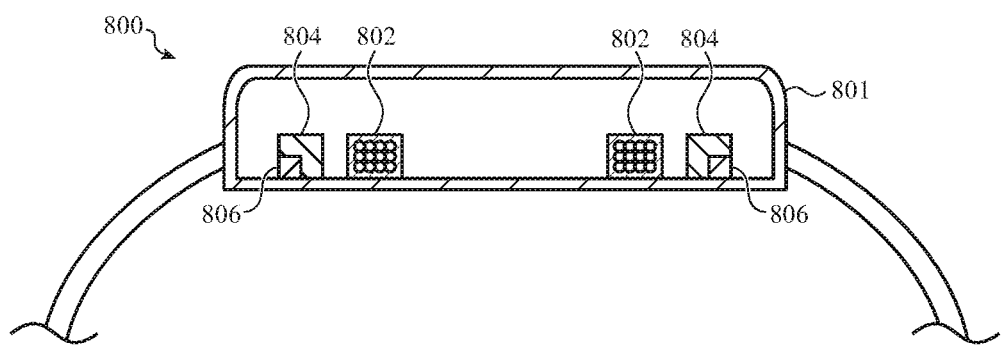
FIG. 8B depicts a partial cross-sectional view of the example wearable electronic device of FIG. 8A in a second mode of operation.

FIG. 8B shows the device 800 in a second mode of operation in which the movable mass 804 is secured or constrained by the retention system 806. In this mode, which may correspond to a charging mode, the retention system 806 may constrain the movable mass 804 so that it does not move in response to the magnetic fields of the coil 802 and/or an output coil of a charger. The retention system 806 may secure or constrain the movable mass 804 using any suitable technique. For example, the retention system 806 may include mechanical components and/or mechanisms that selectively secure and release the movable mass 804. Such components and/or mechanisms may include latches, clips, levers, pins, clamps, or the like. The retention system 806 may include permanent magnets, electromagnets, actuators, piezoelectric elements, or the like instead of or in addition to other mechanical components or mechanisms. In some cases, the coil 802 may assist in causing the movable mass 804 to be constrained or secured by the retention system 806. For example, a drive signal may be provided to the coil 802 that causes the movable mass 804 to mechanically, magnetically, or otherwise engage with the retention system 806 (e.g., by causing the movable mass 804 to be moved against the retention system 806). The coil 802 may also be used to release the movable mass 804, such as by forcing the movable mass 804 away from the retention system 806.

In some cases, it may be desirable to produce a haptic output while a device is charging, such as to cause the device to move or to produce an audible output (e.g., a buzz). In such cases, the retention system 806 may release the movable mass 804 to allow the movable mass 804 to move and thereby produce a haptic output. In some cases, the device 800 may cease a charging operation and supply a current or drive signal to the coil 802, thereby causing the coil 802 to produce the haptic output. In other cases, the device 800 may supply a drive signal to the coil 802 while the coil 802 is inductively coupled to a remote output coil and is producing a current to charge a battery of the device 800.

While the coil in a device may be used to produce magnetic fields or otherwise interact with haptic output components to produce a haptic output, other coils, such as coils external to the device, may also be used to move a movable mass within the device. This may be used for various purposes, such as to cause the device to produce a haptic output while the device is charging without having to cease a charging operation, or to allow an external charger to cause the device to move to align or position the device relative to the charger.

FIGS. 8A-8B illustrate one example configuration in which a movable mass 804 is selectively constrained by a retention system. It will be understood, however, that the same or similar principles may apply to any of the embodiments or configurations described herein. In such cases, the particular structures, orientations, and other configurations may be tailored to suit the particular actuator type, physical constraints, component shapes and/or positioning, etc., of any of the devices described herein.

Figure 9:
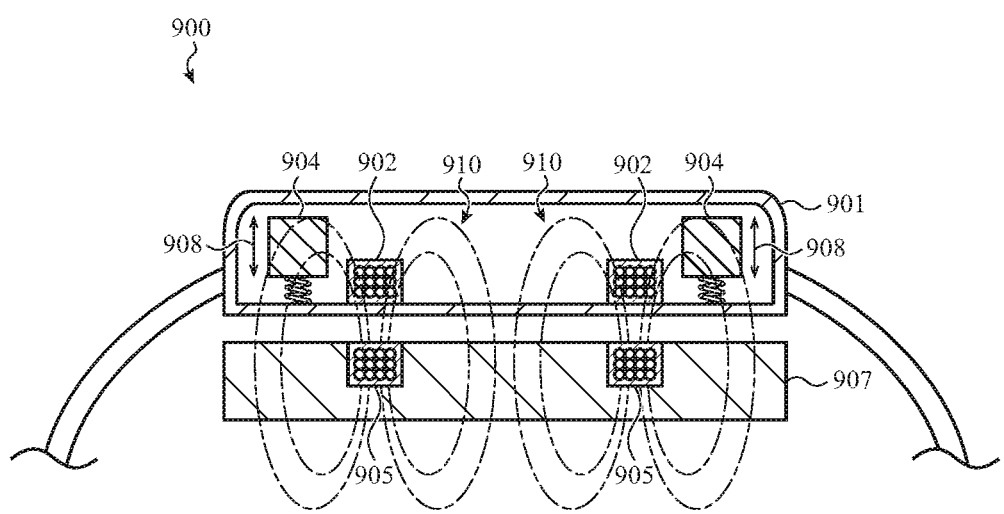
FIG. 9 depicts a partial cross-sectional view of an example wearable electronic device proximate a charger.

FIG. 9 illustrates a partial cross-sectional view of an example device 900 and corresponding charger 907, showing how an external coil can cause a movable mass in the device to move. The device 900 includes a housing 901 and a coil 902 at least partially within the housing 901. The device 900 also includes a movable mass 904 that is configured to move in response to the coil 902 receiving a suitable drive signal or current. The device 900 may be an embodiment of or similar to other devices described herein (e.g., the device 140), and as such details of the devices described herein, including components, structures, uses, functions, etc., may apply to the device 900, and for brevity will not be repeated here.

The device 900 is shown in proximity to a charger 907. The charger 907 includes an output coil 905 that is configured to produce a magnetic field 910. The coil 902 in the device 900 may be configured so that it is within the magnetic field 910 when the device 900 is on the charger 907 (e.g., for charging).

As described above, the movable mass 904 may be configured to move (e.g., oscillate, pulse, translate, etc.) when it is within a magnetic field. For example, in cases where the movable mass 904 is a permanent magnet, the movable mass 904 may move as a result of magnetic attraction, repulsion, or alignment relative to the magnetic field. As another example, where the movable mass 904 is a ferromagnetic element (e.g., an unmagnetized metal), reluctance forces produced as a result of the magnetic field may cause the movable mass 904 to move. These properties may be leveraged so that the output coil 905 of the charger can cause the movable mass 904 to move. In particular, when the device 900 is in proximity to a charger 907 or other device that includes a coil, the output coil 905 may produce a magnetic field that is configured to cause the movable mass 904 to move (as indicated by arrows 908).

The motion of the movable mass 904, caused by the remote coil, may cause the device 900 to move relative to an external component or device. For example, the charger 907 may cause the mass 904 to move in order to align the device 900 relative to the charger 907 (e.g., to improve alignment between the coil 902 and the output coil 905, thereby improving the charging operation). As another example, if the charger 907 is configured as a charging pad with multiple output coils, one or more of the output coils of the charging pad may cause the movable mass 904 to help move the device 900 to a particular location along the charging pad.

In embodiments where a charging pad is used, the charging pad may be able to determine the location of the device 900 on the charging pad by sensing one or more components or signatures of the device 900. For example, the output coils may be able to determine the location and/or orientation of the device 900 based on how the coil 902 in the device electromagnetically interacts with the output coils of the charging pad. Other techniques may also be used by the device and/or the charging pad, such as by the device using Hall Effect sensors in the device to help the device determine its location and/or orientation relative to the charging pad. Once the charging pad and/or the device know a location or orientation of the device relative to the charging pad, the charging pad may cause the movable mass 904 to move (e.g., by energizing or sending a drive signal to one or more output coils) in order to change the position and/or orientation of the device along the charging mat.

As noted above, a coil may be configured so that different coil configurations may be used for different functions. For example, coils as described herein may include multiple conductive windings, and different groupings of the conductive windings may be used for different functions and/or different modes. By using different groupings of the windings for different functions, it may be possible to further optimize the coil parameters for each individual function (e.g., the impedance, resistance, number of turns, location of the windings relative to other components, etc.).

Figure 10A:
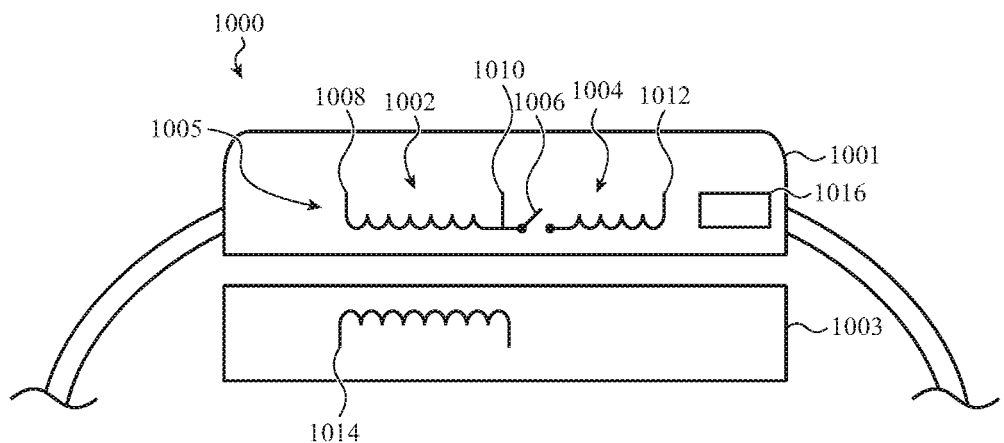
FIG. 10A depicts a partial cross-sectional view of an example wearable electronic device having a segmented coil, in a first mode of operation.
Figure 10B:
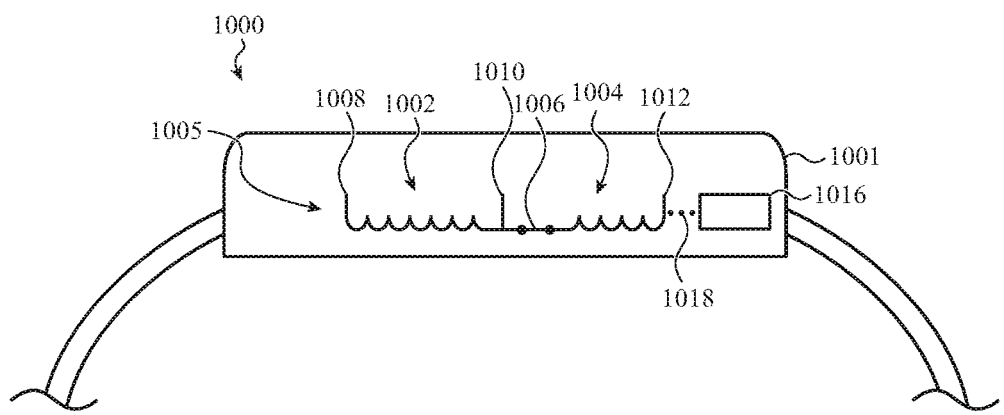
FIG. 10B depicts a partial cross-sectional view of the wearable electronic device of FIG. 10A in a second mode of operation.

FIGS. 10A-10B illustrate a partial cross-sectional view of an example device 1000 and corresponding charger 1003. The device 1000 includes a housing 1001 and a coil 1005 that includes two conductive windings 1002, 1004. The device 1000 also includes a haptic component 1016 (e.g., any suitable component or part of a haptic output system with which the coil 1005 may electrically, magnetically, or otherwise interact to produce a haptic output). The device 1000 may be an embodiment of or similar to other devices described herein (e.g., the device 100), and as such details of the devices described herein, including components, structures, uses, functions, etc., may apply to the device 1000, and for brevity will not be repeated here.

As shown in FIG. 10A, a coil 1005 may include multiple segments, such as a first segment 1002 and a second segment 1004. The first and second segments 1002, 1004 may be different groupings of the conductive windings that make up the overall coil 1005. The coil may also include a switch 1006 that can conductively couple and/or decouple the first segment 1002 and the second segment 1004, as well as multiple taps 1008, 1010, 1012 that allow separate electrical connections to the different coil configurations and combinations available on the coil 1005. The switch 1006 may be or may be part of a switching circuit that conductively couples and/or decouples the conductive windings during different modes or operations of the device 1000.

FIG. 10A illustrates the device 1000 in a first mode (e.g., a charging mode, and/or during a battery charging operation). In this operation, only the first coil segment 1002 is operational to inductively couple to an output coil 1014 of the charger 1003. Where the coil 1005 includes the switch 1006 (which may be a solid-state switching device, an electromechanical switching device, or the like), the switch 1006 may be open. Due to the inductive coupling between the first coil segment 1002 and the output coil 1014, a current may be generated in the first coil segment 1002, which may be provided to the battery via the taps 1008, 1010.

FIG. 10B illustrates the device 1000 in a second mode (e.g., in a non-charging mode, and/or during a haptic output operation). In this operation, both the first and second conductive windings 1002, 1004 are operational. For example, the switch 1006, if present, may be closed to conductively couple the first and second conductive windings 1002, 1004, and a drive signal (e.g., a current) may be provided to the coil 1005 via taps 1008, 1012. The drive signal provided to the coil 1005 may cause the coil to interact with the haptic component 1016 (as illustrated by dotted line 1018), thus producing a haptic output. As described herein, in some cases the haptic component 1016 may be a movable mass, and may be moved due to the electromagnetic field produced by the coil 1005. In other cases, the coil 1005 may be movable and the haptic component 1016 may be stationary, and the haptic output may be produced as a result of the motion of the movable coil.

FIGS. 10A-10B illustrate an example in which a portion of a segmented coil is used to inductively couple to an output coil during a charging operation, and the entire coil is used to produce a haptic output. In other examples, the conductive windings of the coil are used in different combinations and/or schemes. For example, the entire coil may be used for wireless charging, while only part of the coil is used for haptic outputs.

Figure 11A:
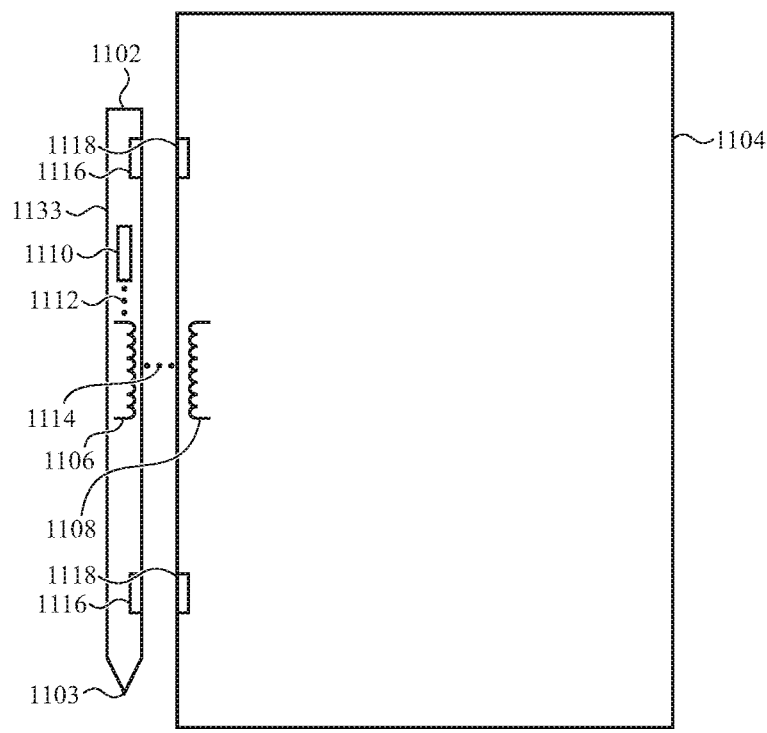
FIG. 11A depicts an example electronic device with a coil.

FIGS. 1C-10B depict a smartwatch as an example electronic device that may use a coil as part of both a haptic output system and a wireless charging system. However, as noted above, this is merely one type of device that may use a coil for these purposes. For example, FIG. 11A depicts a stylus 1102 for use with an electronic device 1104, such as a tablet, mobile phone, notebook computer, or other device that is configured to accept inputs from the stylus 1102. For example, the stylus 1102 may include a tip 1103 that is configured to provide input to the electronic device 1104. As one example, the tip 1103 may be configured to be placed into contact with a touch-sensitive area (e.g., a touch-sensitive display) of the electronic device 1104 (and moved along the touch-sensitive area), such that the electronic device 1104 can detect the location of the contact between the tip 1103 and the touch-sensitive area and take appropriate action in response to detecting the contact. The tip 1103 may also be coupled to and/or associated with a force-sensing system of the stylus 1102. The force-sensing system may be configured to sense or detect an amount of force with which the stylus 1102 is being pressed onto a surface (e.g., a touchscreen of a tablet device, or any other suitable interface surface). Force information may be provided to the electronic device 1104 by the stylus 1102, and the electronic device 1104 may take appropriate action based on the received information. For example, if the stylus 1102 is used to draw a graphic (e.g., a line, shape, etc.), the darkness of the graphic (or another property such as thickness) may vary in accordance with the force (e.g., greater force results in a darker or thicker graphic).

The stylus 1102 may also include an elongate housing 1133 which may be a substantially tubular structure (or any other suitable pen- or pencil-like shape) that can be manipulated by a user in a manner similar to a pen or pencil. The housing 1133 (e.g., a length axis of the housing 1133) may extend from a first end to a second end, and a tip 1103 may be positioned at the second end of the housing 1133. The housing 1133 may define an internal cavity in which components such as a battery, a wireless communication system, a coil 1106, a haptic component 1110, magnetic attachment features 1116, a force-sensing system, or the like, are positioned.

The wireless communication system of the stylus 1102 may be configured to communicate with the electronic device with which the stylus 1102 is being used. For example, when the stylus 1102 is being used with a tablet computer, the wireless communication system of the stylus 1102 may send and/or receive information such as a unique identifier of the stylus 1102, orientation information of the stylus (e.g., from a magnetometer, accelerometer, or other sensor in the stylus 1102), pressure and/or force information (e.g., from the pressure and/or force sensor associated with the tip 1103), or the like.

The stylus 1102 may include a coil 1106 that is configured to inductively couple with an output coil 1108 of the electronic device 1104 in order to receive power from the output coil 1108 (as illustrated by dotted line 1114). Power for the output coil 1108 may be supplied from a battery in the electronic device 1104 or via another source. When the stylus 1102 is in a charging mode, the power received by the coil 1106 may be supplied to a battery charging system of the stylus 1102.

The stylus 1102 also includes a haptic component 1110. The haptic component 1110 may be any suitable component or part of a haptic output system with which the coil may electrically, magnetically, or otherwise interact to produce a haptic output. For example, the haptic component 1110 may be a movable mass, a magnet, a ferromagnetic element, or any other suitable component or material. FIG. 7A shows an example of how the coil 1106 may be integrated with haptic components in order to produce haptic outputs. For example, the coil 1106 may be wrapped about a first armature component (e.g., the first armature component 704), and a second armature component (e.g., the second armature component 706) may be positioned proximate the first armature component. The coil 1106 may be energized to cause the first and second armature components to be attracted to and/or repelled from one another in a manner that produces a haptic output. It will be understood that the haptic systems (e.g., the coils and armatures) described with respect to FIGS. 7A-7B may be implemented in the stylus 1102, and as such the details of those systems will not be repeated here for brevity.

During a haptic output operation, the coil 1106 may interact with the haptic component 1110, as illustrated by dotted line 1112. For example, the haptic component 1110 may be a movable magnet, and the coil 1106 may be supplied with a drive signal to produce a magnetic field that attracts and/or repels the movable magnet to produce an oscillation, vibration, pulse, or the like, that results in a tactile output. The haptic or tactile output may be produced by the stylus 1102 for various reasons and in response to various conditions or triggering events. For example, the stylus 1102 may produce a haptic output when a user changes a function associated with the stylus 1102 (e.g., when a user switches from a writing mode to an erasing mode). As another example, the stylus 1102 may produce a haptic output when the user attempts to provide an input that is not supported (e.g., if a user tries to draw in an area of a display or a user interface where drawing inputs are not accepted).

The stylus 1102 may be configured to be removably attached to the electronic device 1104. For example, the stylus 1102 may include magnetic attachment features 1116 (formed of magnets and/or magnetic materials) and the electronic device 1104 may include complementary magnetic attachment features 1118 (formed of magnets and/or magnetic materials) that magnetically couple to the magnetic attachment features 1116. In some cases, the stylus 1102 may initiate a charging mode in response to detecting that it has been attached to the electronic device 1104 via the magnetic attachment features. In the charging mode, the stylus 1102 may receive power (e.g., wirelessly) from the electronic device 1104 along a side surface of the elongate housing 1133 of the stylus 1102.

When the stylus 1102 detects that it has been detached from the electronic device 1104, it may cease operating in the charging mode. The stylus 1102 may detect that it has been detached from the electronic device 1104 in any suitable manner, such as via a sensor (e.g., a Hall effect sensor) on the stylus 1102, by detecting a change in an electrical property of the coil 1106 (e.g., a change due to the cessation of inductive coupling between the coil 1106 and the output coil 1108), or the like.

Figure 11B:
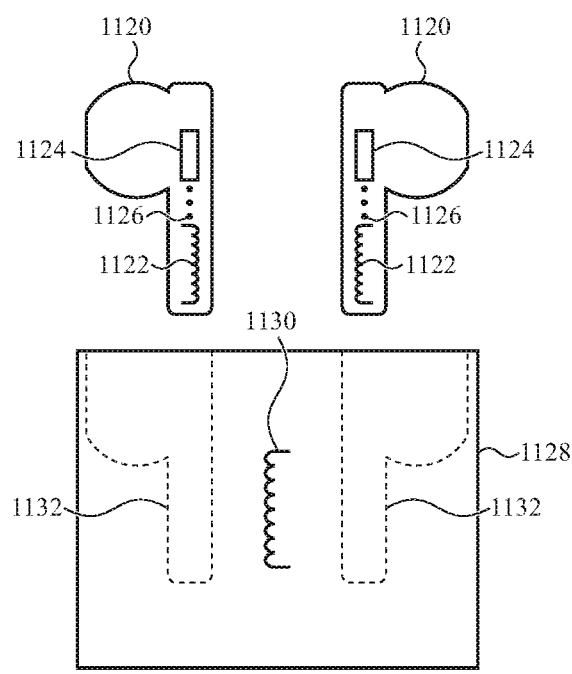
FIG. 11B depicts another example electronic device.

FIG. 11B depicts another type of electronic device that may use a coil for both a haptic output system and a wireless charging system. In particular, FIG. 11B depicts earbuds 1120 that each include a coil 1122 that is configured to inductively couple with an output coil 1130 of a storage case 1128 in order to receive power from the output coil 1130. Power for the output coil 1130 may be supplied from a battery in the electronic storage case 1128. When the earbuds 1120 are in a charging mode, the power received by the coils 1122 may be supplied to a battery charging system of the earbuds 1120. While one output coil 1130 is shown in the storage case 1128, in some cases the storage case 1128 includes more output coils, such as one dedicated output coil for each earbud 1120.

The earbuds 1120 also include haptic components 1124. The haptic components 1124 may be any suitable component or part of a haptic output system with which the coils 1122 may electrically, magnetically, or otherwise interact to produce a haptic output. For example, the haptic components 1124 may be movable masses, magnets, ferromagnetic elements, or any other suitable components or materials. During a haptic output operation, the coils 1122 may interact with the haptic components 1124, as illustrated by dotted lines 1126. For example, the haptic components 1124 may be movable magnets, and the coils 1122 may be supplied with a drive signal to produce a magnetic field that attracts and/or repels the movable magnets to produce an oscillation, vibration, pulse, or the like, that results in a tactile output. The haptic or tactile output may be produced by the earbuds 1120 for various reasons and in response to various conditions or triggering events. For example, the earbuds 1120 may produce a haptic output to alert a user to an incoming message or voice/video call, to indicate a low-battery status of the earbuds, to provide directional information to the user (e.g., to indicate the direction of a real-world person or object, or of a virtual audio source that is associated with a virtual position relative to a wearer), to supplement or enhance audio output of the earbuds (e.g., producing a haptic output upon detecting a low-frequency audio signal, such as a bass note, where the haptic output may have a frequency that matches that of the detected low-frequency audio signal). Other events may cause the earbuds 1120 to produce haptic outputs as well.

The storage case 1128 may define earbud holding chambers 1132 that are configured to receive the earbuds therein. The chambers 1132 may substantially conform to the shape of the earbuds to hold the earbuds in place. When positioned in the holding chambers 1132, the coils 1122 of the earbuds may be positioned relative to the output coil 1130 of the storage case 1128 such that the coils 1122 and 1130 can inductively couple to one another to facilitate wireless power transfer. In some cases, the earbuds 1120 may be retained in the chambers 1132 via magnets, a lid, latches, or any other suitable mechanism. In some cases, the earbuds 1120 may initiate a charging mode in response to detecting that they have been inserted into the chambers 1132 of the storage case 1128. When the earbuds 1120 detect that they have been detached from the storage case 1128, they may cease operating in the charging mode.

In some cases, the storage case 1128 itself may be capable of being wirelessly charged, and may include a coil that facilitates both wireless charging and haptic outputs, similar to the other devices described herein. For example, the storage case 1128 may use a coil for wirelessly charging an onboard battery (which is in turn used to provide power to charge the earbuds 1120), as well as for producing a haptic output. The haptic output may be produced in response to the earbuds 1120 being inserted and/or removed from the storage case 1128, in response to a battery of the storage case 1128 reaching a particular level (e.g., fully charged, 10% charge remaining, etc.), in response to the storage case 1128 beginning or ending a charge operation (e.g., in response to the storage case 1128 being placed near or removed from a wireless charger), or the like.

Figure 12:
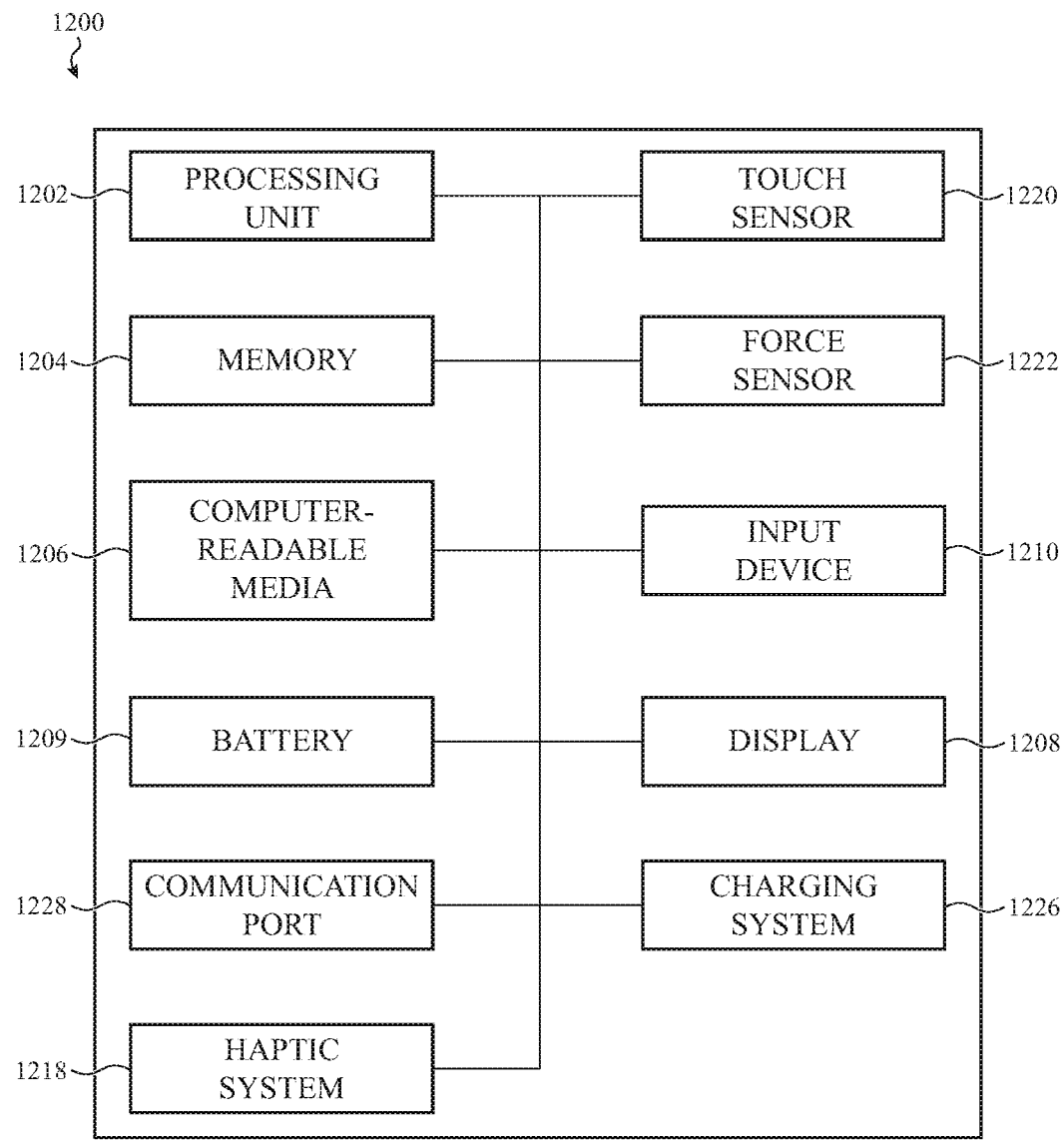
FIG. 12 depicts example components of an electronic device.

FIG. 12 depicts an example schematic diagram of an electronic device 1200. By way of example, the device 1200 of FIG. 12 may correspond to the electronic device 100 shown in FIGS. 1A-1B, the electronic device 140 shown in FIGS. 1C-1D, the electronic devices 200, 201 shown in FIGS. 2A-2C, the stylus 1102 shown in FIG. 11A, the earbuds 1120 and/or the charging case 1128 shown in FIG.

11B, or to any other electronic device described herein. To the extent that multiple functionalities, operations, and structures are disclosed as being part of, incorporated into, or performed by the device 1200, it should be understood that various embodiments may omit any or all such described functionalities, operations, and structures. Thus, different embodiments of the device 1200 may have some, none, or all of the various capabilities, apparatuses, physical features, modes, and operating parameters discussed herein.

As shown in FIG. 12, a device 1200 includes a processing unit 1202 operatively connected to computer memory 1204 and/or computer-readable media 1206. The processing unit 1202 may be operatively connected to the memory 1204 and computer-readable media 1206 components via an electronic bus or bridge. The processing unit 1202 may include one or more computer processors or microcontrollers that are configured to perform operations in response to computer-readable instructions. The processing unit 1202 may include the central processing unit (CPU) of the device. Additionally or alternatively, the processing unit 1202 may include other processors within the device including application specific integrated chips (ASIC) and other microcontroller devices.

The memory 1204 may include a variety of types of non-transitory computer-readable storage media, including, for example, read access memory (RAM), read-only memory (ROM), erasable programmable memory (e.g., EPROM and EEPROM), or flash memory. The memory 1204 is configured to store computer-readable instructions, sensor values, and other persistent software elements. Computer-readable media 1206 also includes a variety of types of non-transitory computer-readable storage media including, for example, a hard-drive storage device, a solid-state storage device, a portable magnetic storage device, or other similar device. The computer-readable media 1206 may also be configured to store computer-readable instructions, sensor values, and other persistent software elements.

In this example, the processing unit 1202 is operable to read computer-readable instructions stored on the memory 1204 and/or computer-readable media 1206. The computer-readable instructions may adapt the processing unit 1202 to perform the operations or functions described above with respect to FIGS. 1A-11B. In particular, the processing unit 1202, the memory 1204, and/or the computer-readable media 1206 may be configured to operate a coil in various modes of operation, such as a charging mode (in which the coil inductively couples with an output coil, thereby producing a current to charge a battery) and a haptic output mode (in which a drive signal is provided to the coil to produce a haptic output). The computer-readable instructions may be provided as a computer-program product, software application, or the like.

As shown in FIG. 12, the device 1200 also includes a display 1208. The display 1208 may include a liquid-crystal display (LCD), an organic light emitting diode (OLED) display, a light emitting diode (LED) display, or the like. If the display 1208 is an LCD, the display 1208 may also include a backlight component that can be controlled to provide variable levels of display brightness. If the display 1208 is an OLED or LED type display, the brightness of the display 1208 may be controlled by modifying the electrical signals that are provided to display elements. The display 1208 may correspond to any of the displays shown or described herein.

The device 1200 may also include a battery 1209 that is configured to provide electrical power to the components of the device 1200. The battery 1209 may include one or more power storage cells that are linked together to provide an internal supply of electrical power. The battery 1209 may be operatively coupled to power management circuitry that is configured to provide appropriate voltage and power levels for individual components or groups of components within the device 1200. The battery 1209 may store received power so that the device 1200 may operate without connection to an external power source for an extended period of time, which may range from several hours to several days.

In some embodiments, the device 1200 includes one or more input devices 1210. An input device 1210 is a device that is configured to receive user input. The one or more input devices 1210 may include, for example, a crown input system, a push button, a touch-activated button, a keyboard, a key pad, or the like (including any combination of these or other components). In some embodiments, the input device 1210 may provide a dedicated or primary function, including, for example, a power button, volume buttons, home buttons, scroll wheels, and camera buttons.

The device 1200 may also include a touch sensor 1220 that is configured to determine a location of a touch on a touch-sensitive surface of the device 1200 (e.g., an input surface defined by the portion of a cover 108 that covers a display 109). The touch sensor 1220 may use or include capacitive sensors, resistive sensors, surface acoustic wave sensors, piezoelectric sensors, strain gauges, or the like. In some cases the touch sensor 1220 associated with a touch-sensitive surface of the device 1200 may include a capacitive array of electrodes or nodes that operate in accordance with a mutual-capacitance or self-capacitance scheme. The touch sensor 1220 may be integrated with one or more layers of a display stack (e.g., the display 109) to provide the touch-sensing functionality of a touchscreen.

The device 1200 may also include a force sensor 1222 that is configured to receive and/or detect force inputs applied to a user input surface of the device 1200 (e.g., the display 109). The force sensor 1222 may use or include capacitive sensors, resistive sensors, surface acoustic wave sensors, piezoelectric sensors, strain gauges, or the like. In some cases, the force sensor 1222 may include or be coupled to capacitive sensing elements that facilitate the detection of changes in relative positions of the components of the force sensor (e.g., deflections caused by a force input). The force sensor 1222 may be integrated with one or more layers of a display stack (e.g., the display 109) to provide force-sensing functionality of a touchscreen.

The device 1200 may also include a communication port 1228 that is configured to transmit and/or receive signals or electrical communication from an external or separate device. The communication port 1228 may be configured to couple to an external device via a cable, adaptor, or other type of electrical connector. In some embodiments, the communication port 1228 may be used to couple the device 1200 to an accessory, including a dock or case, a stylus or other input device, a smart cover, a smart stand, a keyboard, or other device configured to send and/or receive electrical signals.

The device 1200 may also include a haptic output system 1218. The haptic output system 1218 may be configured to produce haptic outputs that are detectable by a user of the device, such as vibrations, oscillations, pulses, translations, or the like. The haptic output system may include any suitable actuators and/or devices that produce haptic outputs, such as linear actuators, resonant linear actuators, solenoids, voice coil motors, reluctance force actuators, or the like. In some cases, the haptic output system 1218 may include or be coupled to a coil (that is also included in or coupled to a battery charging system) that produces haptic outputs via electromagnetic interactions with other components of the device 1200 (e.g., permanent magnets, ferromagnetic materials, other coils, etc.)

The device 1200 may also include a charging system 1226 that charges the battery 1209 of the device. The charging system 1226 may be configured to wirelessly receive power via an inductive coupling between a coil in the device 1200 (e.g., the same coil used to produce haptic outputs via the haptic output system 1218) and an output coil of a charger, as described herein.

Devices such as those described herein (e.g., wearable electronic devices, electronic watches, smartphones, tablets, etc.) may gather and use data from and/or about a user. It is well understood that the use of personally identifiable information (such as information from or about a user or the user's environment and that is stored on or accessible by a device) should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The devices shown and described with respect to FIGS. 1A-12 may include different or additional components than those shown in the figures, particularly with respect to the systems that provide haptic output functionality and battery charging functionality. For example, the devices that are shown and described may also include components such as flux guides, flux concentrators, shields, ferromagnetic frames, additional or differently shaped permanent magnets, shunts, or the like. Moreover, additional or different structural components, mechanisms, fixtures, fasteners, and the like (e.g., for positioning and/or coupling components of the haptic output systems to the device housing) may be included in the devices described herein.

Moreover, while the haptic output systems described herein primarily produce haptic outputs that are detectable along an exterior surface of a device housing, the devices may be configured to produce haptic outputs via any component or member of a device. For example, a coil that is used for charging and for producing haptic outputs may be configured to cause a crown of an electronic watch (or a button or other input member) to move relative to the watch housing. As another example, the coil may be configured to cause a transparent cover of the watch to move relative to the housing.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. Also, when used herein to refer to positions of components, the terms above and below, or their synonyms, do not necessarily refer to an absolute position relative to an external reference, but instead refer to the relative position of components with reference to the figures.

What is claimed is:

1. An electronic watch comprising:
    a housing at least partially defining an internal volume and comprising a dielectric member defining a charging surface along a back side of the electronic watch, the charging surface configured to contact an external charging device during a battery charging operation;
    a display positioned at least partially within the housing;
    a transparent cover coupled to the housing and at least partially covering the display;
    a battery;
    a magnet positioned within the internal volume, the magnet movable relative to the housing and configured to magnetically align the housing relative to the external charging device during the battery charging operation; and
    a stationary coil conductively coupled to the battery and comprising multiple conductive windings, the stationary coil configured to:
        during the battery charging operation, supply a first current to the battery from a first grouping of the multiple conductive windings; and
        during a haptic output operation, receive a second current from the battery at a second grouping of the multiple conductive windings to move the magnet, thereby producing a haptic output, the second grouping of conductive windings different from the first grouping of conductive windings.

2. The electronic watch of claim 1, wherein:
    the stationary coil is configured to inductively couple to an output coil of the external charging device during the battery charging operation;
    the second current causes the stationary coil to produce a magnetic field; and
    the haptic output is produced as a result of an interaction between the magnetic field and the magnet that causes the magnet to move relative to the housing.

3. The electronic watch of claim 2, wherein the magnet is movably coupled to the housing via a compliant member.

4. The electronic watch of claim 1, wherein:
    the housing comprises:
        a first housing member defining a first exterior surface of the housing; and
        a second housing member defining a second exterior surface of the housing configured to contact a user when the electronic watch is being worn.

5. The electronic watch of claim 4, wherein:
    the transparent cover defines a front surface of the electronic watch; and
    the second housing member defines at least a portion of a rear surface of the electronic watch, the rear surface opposite the front surface.

6. The electronic watch of claim 1, wherein the stationary coil is configured to produce the first current as a result of a wireless power transfer from the external charging device to the stationary coil.

7. The electronic watch of claim 1, further comprising a retention system configured to constrain movement of the magnet during the battery charging operation.

8. The electronic watch of claim 1, wherein the magnet is a ring-shaped magnet.

9. The electronic watch of claim 1, wherein the magnet is positioned in a central area defined by the stationary coil.

10. The electronic watch of claim 1, wherein the second grouping of the multiple conductive windings comprises more windings than the first grouping of the multiple conductive windings.

11. An electronic device comprising:
a housing comprising a dielectric material defining an exterior surface of the electronic device, the exterior surface configured to contact an external power source during a charging operation;
a battery positioned at least partially within the housing;
a stationary coil positioned at least partially within the housing and comprising multiple conductive windings; and
a movable magnet positioned at least partially within the housing and configured to magnetically align the electronic device relative to the external power source, wherein:
in a first mode of operation, a first grouping of the multiple conductive windings of the stationary coil wirelessly receives power from the external power source, the received power being provided to the battery; and
in a second mode of operation, a second grouping of the multiple conductive windings of the stationary coil receives a drive signal, thereby causing the movable magnet to move and produce a haptic output along the exterior surface of the housing, the second grouping different from the first grouping.

12. The electronic device of claim 11, wherein:
the electronic device is a stylus comprising:
an elongate housing defining a first end and a second end and defining an internal cavity;
a tip positioned at the second end of the elongate housing and configured to provide input to an additional electronic device; and
the exterior surface is a side surface of the elongate housing.

13. The electronic device of claim 11, wherein:
the electronic device is a watch comprising:
a display positioned at least partially within the housing and configured to display a graphical output;
a transparent cover positioned over the display; and
a touch sensor positioned below the transparent cover and configured to detect a touch input applied to the transparent cover;
the housing defines a rear wall along a rear side that is opposite to the transparent cover, the rear wall comprising the dielectric material; and
the first grouping of the multiple conductive windings coil is configured to inductively couple to an output coil through the dielectric material when the electronic device is in the first mode of operation.

14. The electronic device of claim 11, wherein:
in the second mode of operation, the drive signal causes a current to pass through the second grouping of the multiple conductive windings coil; and
the second grouping of the multiple conductive windings coil causes the movable magnet to move as a result of an interaction between a magnetic field produced by the movable magnet and Lorentz forces acting on the second grouping of the multiple conductive windings.

15. The electronic device of claim 11, wherein:
the movable magnet is coupled to the housing via a compliant member that allows the movable magnet to move relative to the housing; and
the electronic device further comprises a retention system configured to constrain movement of the movable magnet when the electronic device is in the first mode of operation.

16. The electronic device of claim 11, wherein:
the stationary coil comprises two coil segments conductive windings; and
the electronic device further comprises a switching circuit configured to:
conductively couple the two coil segments during the second mode of operation; and
conductively decouple the two coil segments during the first mode of operation.

17. The electronic device of claim 11, wherein:
the stationary coil comprises multiple turns of a wire wrapped about a central area; and
the movable magnet is positioned at least partially within the central area.

18. An electronic device comprising:
a housing comprising a dielectric member defining a charging surface along a back side of the electronic device;
a display positioned at least partially within the housing;
a transparent cover positioned over the display and defining a front surface of the electronic device;
a battery positioned at least partially within the housing;
a magnet positioned within the housing, the magnet movable relative to the housing and configured to magnetically align the housing relative to an external charging device during a battery charging operation; and
a stationary coil positioned at least partially within the housing and comprising multiple conductive windings, the stationary coil configured to:
produce, using a first grouping of the multiple conductive windings, a current when the first grouping of the multiple conductive windings is inductively coupled to an output coil of the external charging device through the dielectric member, the current being used to charge the battery; and
produce, using a second grouping of the multiple conductive windings different from the first grouping of the multiple conductive windings, a magnetic field when the second grouping of the multiple conductive windings is supplied with a current from the battery, the magnetic field configured to cause the magnet to move within the housing, thereby producing a haptic output detectable along an exterior surface of the electronic device.

19. The electronic device of claim 18, further comprising a retention system configured to:
secure the magnet when the coil first grouping of the multiple conductive windings is inductively coupled to the output coil; and
release the magnet when the second grouping of the multiple conductive windings is supplied with the current from the battery to produce the haptic output.

20. The electronic device of claim 18, wherein the housing comprises a metal housing member coupled to the dielectric member and defining a side surface of the electronic device.

* * * * *